(12) United States Patent
Akiho et al.

(10) Patent No.: US 8,703,018 B2
(45) Date of Patent: *Apr. 22, 2014

(54) RED PHOSPHOR, METHOD FOR PRODUCING RED PHOSPHOR, WHITE LIGHT SOURCE, ILLUMINATING DEVICE, AND LIQUID CRYSTAL DISPLAY DEVICE

(75) Inventors: Hiraku Akiho, Miyagi (JP); Tsuneo Kusunoki, Kanagawa (JP); Takahiro Igarashi, Kanagawa (JP); Takamasa Izawa, Kanagawa (JP)

(73) Assignee: Dexerials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/426,230

(22) Filed: Mar. 21, 2012

(65) Prior Publication Data

US 2012/0326086 A1 Dec. 27, 2012

Related U.S. Application Data

(63) Continuation of application No. 13/001,252, filed as application No. PCT/JP2009/062244 on Jun. 30, 2009.

(30) Foreign Application Priority Data

Jul. 2, 2008 (JP) .............................. P2008-173467
May 21, 2009 (JP) .............................. P2009-122757

(51) Int. Cl.
*C09K 11/08* (2006.01)
*C09K 11/66* (2006.01)

(52) U.S. Cl.
USPC ................................................. 252/301.4 F

(58) Field of Classification Search
USPC ............. 252/301.4 F, 301.4 R; 313/486, 503
See application file for complete search history.

(56) References Cited

U.S. PATENT DOCUMENTS 7,074,346 B2 * 7/2006 Yamada et al. ......... 252/301.4 F
7,391,060 B2 * 6/2008 Oshio ............................ 257/98
8,105,502 B2 * 1/2012 Fukuda et al. ......... 252/301.4 R
2006/0220047 A1 10/2006 Nagatomi et al.

(Continued)

FOREIGN PATENT DOCUMENTS

JP 2002-060747 2/2002
JP 2005-235934 9/2005

(Continued)

OTHER PUBLICATIONS

Suehiro. Powder Synthesis of Ca-rɛ-SiAlON as a Host Material for Phosphors. Chem. Mater. 2005, 17, 308-314.*

(Continued)

*Primary Examiner* — Carol M Koslow
*Assistant Examiner* — Matthew E Hoban
(74) *Attorney, Agent, or Firm* — Oliff PLC

(57) ABSTRACT

A compound is provided containing silicon, aluminum, strontium, europium, nitrogen, and oxygen is used that enables a red phosphor having strong luminous intensity and high luminance to be obtained, and that enables the color gamut of a white LED to be increased with the use of the red phosphor. The red phosphor contains an element A, europium, silicon, aluminum, oxygen, and nitrogen at the atom number ratio of the following formula: $[A_{(m-x)}Eu_x]Si_9Al_yO_nN_{[12+y-2(n-m)/3]}$. The element A in the formula is at least one of magnesium, calcium, strontium, and barium, and m, x, y, and n in the formula satisfy the relations $3<m<5$, $0<x<1$, $0<y<2$, and $0<n<10$.

11 Claims, 26 Drawing Sheets

(56) References Cited

U.S. PATENT DOCUMENTS

| | | |
|---|---|---|
| 2006/0244356 A1* | 11/2006 | Nagatomi et al. ............ 313/485 |
| 2008/0180948 A1 | 7/2008 | Yoon et al. |
| 2009/0026915 A1 | 1/2009 | Nagatomi et al. |
| 2010/0001234 A1* | 1/2010 | Gotoh et al. ............ 252/301.4 F |

FOREIGN PATENT DOCUMENTS

| | | |
|---|---|---|
| JP | 2008-120946 | 5/2008 |
| JP | 2008-166825 | 7/2008 |
| WO | 2006/106883 | 10/2006 |
| WO | 2009/031089 | 3/2009 |

OTHER PUBLICATIONS

International Search Report dated Aug. 3, 2009, for corresponding Patent Application PCT/JP2009/062244.

Yumi, "Luminescence properties of Eu-doped red-emitting Sr-sialon phosphor", JSAP and Related Societies, proceeding, Mar. 27, 2008, p. 1523.

* cited by examiner (1)

(2)

(1)

(2)

MAGNIFIED PORTION (y+9)/m=2.425 x/m=3.75%

RELATIONSHIP BETWEEN MELAMINE AMOUNT AND LUMINOUS INTENSITY

RED PHOSPHOR, METHOD FOR PRODUCING RED PHOSPHOR, WHITE LIGHT SOURCE, ILLUMINATING DEVICE, AND LIQUID CRYSTAL DISPLAY DEVICE

CROSS REFERENCE TO RELATED APPLICATIONS

The present application is a Continuation of U.S. patent application Ser. No. 13/001,252 filed on Mar. 29, 2011, which is a National Stage of International Application No. PCT/JP2009/062244 filed on Jun. 30, 2009 and which claims priority to Japanese Patent Application No. JP2008-173467 filed on Jul. 2, 2008 and Japanese Patent Application No. JP2009-122757 filed on May 21, 2009, the entire contents of which are being incorporated herein by reference.

BACKGROUND

The present disclosure relates to a red phosphor, and a method of production thereof, and to white light sources, illuminating devices, and liquid crystal display devices using a red phosphor.

A white light source formed of a light-emitting diode is used as the backlight of illuminating devices and liquid crystal display devices. A known example of such a white light source is one in which a cerium-containing yttrium aluminum garnet (hereinafter, "YAG:Ce") phosphor is disposed on the emission side of a blue-emitting diode (hereinafter, "blue LED").

As another example, those including green and red sulfide phosphors disposed on the emission side of a blue LED are known (see, for example, Patent Document 1). Further, there has been proposed a configuration in which a fluorescent material prepared as a solid solution of elements such as Mn and Eu in a $CaAlSiN_3$ crystal is disposed on the emission side of a blue-purple- or blue-glowing LED with another fluorescent material at a predetermined proportion (see, for example, Patent Document 2).

Patent Document 1: JP-A-2002-60747
Patent Document 2: Japanese Patent No. 3931239

However, because the white light source including the YAG:Ce phosphor disposed on the emission side of the blue LED lacks a red component in the YAG:Ce phosphor emission spectrum, the white light appears bluish, and the color gamut is narrow. Thus, it is difficult to produce pure white illumination with illuminating devices that use such a white light source. Further, display with desirable color reproducibility is difficult to achieve with a liquid crystal display device that uses such a white light source as the backlight.

In the white light source including the green and red sulfide phosphors disposed on the emission side of the blue LED, luminance degrades overtime because the sulfide red phosphor undergoes hydrolysis. It is therefore difficult to produce high-quality illumination or display of non-degrading luminance with an illuminating device or a liquid crystal display device that uses such a white light source.

The white light source using the fluorescent material prepared as a solid solution of elements such as Mn and Eu in a $CaAlSiN_3$ crystal is laborious, because it uses and mixes two kinds of fluorescent material.

It is therefore desired to provide a red phosphor of strong luminous intensity and high luminance, a method of production thereof, a white light source and an illuminating device that use the red phosphor and produce pure white illumination, and a liquid crystal display device that has desirable color reproducibility.

SUMMARY

In order to achieve the foregoing object, a red phosphor of an embodiment contains an element A, europium (Eu), silicon (Si), aluminum (Al), oxygen (O), and nitrogen (N) in the proportions of the composition formula (1)

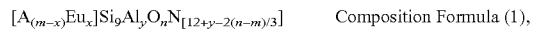

$[A_{(m-x)}Eu_x]Si_9Al_yO_nN_{[12+y-2(n-m)/3]}$   Composition Formula (1), where the element A in the composition formula (1) is at least one of magnesium (Mg), calcium (Ca), strontium (Sr), and barium (Ba). Further, in the composition formula (1), m, x, y, and n in the composition formula (1) satisfy the relations $3<m<5$, $0<x<1$, $0<y<2$, and $0<n<10$.

By the inclusion of strontium and europium, the red phosphor of the configuration above is capable of red emission, and, because of the foregoing composition, luminous intensity is strong and luminance is high. It was confirmed that the red phosphor was capable of producing a luminous intensity about 1.5 times higher than that of the YAG:Ce phosphor at the emission peak wavelength of, for example, 662 nm.

A producing method of such a red phosphor according to an embodiment, is also provided. A carbonate compound of element A, europium nitride, silicon nitride, and aluminum nitride are prepared so as to contain the element A, europium (Eu), silicon (Si), and aluminum (Al) at the proportions of the composition formula (1). These are mixed with melamine to produce a mixture. The mixture is calcined, and the resulting calcined product is pulverized. As a result, the red phosphor of the composition formula (1) can be obtained.

In an embodiment a white light source is provided in which a kneaded product of the red phosphor and a green phosphor in a transparent resin is disposed on a blue-emitting diode, an illuminating device that includes a plurality of such white light sources on a substrate, and a liquid crystal display device that uses the white light source as the backlight of a liquid crystal display panel.

Because the red phosphor of the embodiment is used, the white light source of the present invention has a peak emission wavelength in the red waveband (for example, 640 nm to 770 nm waveband), and has strong luminous intensity and high luminance. As a result, bright white light of three primary colors including the blue light by the blue-emitting diode, the green light by the green phosphor, and the red light by the red phosphor can be obtained. The illuminating device and the backlight using such a white light source are therefore capable of producing illumination and display with bright white emission.

As described above, with the emission peak wavelength in the red waveband, the red phosphor of the present invention is capable of red emission, and has stronger luminous intensity and higher luminance than those of the conventional phosphor.

Because the white light source of the embodiment uses the red phosphor of the present invention that has an emission peak wavelength in the red waveband, and that possesses stronger luminous intensity and higher luminance than those of the conventional red phosphor, bright white light with a wide color gamut can be advantageously obtained.

Because the illuminating device of the embodiment uses the white light source of the present invention, bright white light with a wide color gamut can be obtained, and thus high-luminance pure white illumination can be produced.

The liquid crystal display device of the embodiment uses the white light source of the present invention as the backlight that illuminates the liquid crystal display panel, and thus the liquid crystal display panel can be illuminated with bright white light of a wide color gamut. Thus, high-luminance pure white can be obtained on the display screen of the liquid crystal display panel, and high-quality display with superior color reproducibility can be performed.

Additional features and advantages are described herein, and will be apparent from, the following Detailed Description and the figures.

DETAILED DESCRIPTION

Embodiments are described below with reference to the accompanying drawings, in the following order.

1. First Embodiment (configuration of red phosphor)
2. Second Embodiment (red phosphor producing method)
3. Third Embodiment (exemplary configuration of white light source)
4. Fourth Embodiment (exemplary configuration of illuminating device)
5. Fifth Embodiment (exemplary configuration of liquid crystal display device)

1. First Embodiment (Configuration of Red Phosphor)

The red phosphor is a compound that contains an element A, europium (Eu), silicon (Si), aluminum (Al), oxygen (O), and nitrogen (N) at the proportions of the composition formula (1) below.

$[A_{(m-x)}Eu_x]Si_9Al_yO_nN_{[12+y-2(n-m)/3]}$    Composition Formula (1),

The element A in the composition formula (1) is at least one of magnesium (Mg), calcium (Ca), strontium (Sr), and barium (Ba), and may be more than one kind of these elements. Preferably, strontium (Sr) is used for element A. By containing calcium (Ca) as element A, the emission peak wavelength of the red phosphor can be controlled according to the calcium (Ca) content, as will be described later.

In the composition formula (1), m, x, y, and n satisfy the relations 3<m<5, 0<x<1, 0<y<2, and 0<n<10.

The atom number ratio of the nitrogen (N) [12+y−2(n−m)/3] in the composition formula (1) is calculated so that the sum of the atom number ratio of each element in the composition formula (1) becomes neutral. Specifically, when the atom number ratio of the nitrogen (N) in the composition formula (1) is α, and when the charge of each element in the composition formula (1) is compensated, the following equation is obtained.

$$2(m-x)+2x+4\times 9+3y-2n-3\alpha=0$$

From this, the atom number ratio of the nitrogen (N) can be calculated as follows.

$$\alpha=12+y-2(n-m)/3$$

The red phosphor of composition formula (1) is a compound of a crystal structure that belongs to an orthorhombic system spatial point group Pmn21, specifically, a configuration in which some of the silicon (Si) atoms are replaced with aluminum (Al) in the crystal structure.

The characteristics of the red phosphor of such a configuration are described below.

Optical Characteristics

Figure 1:
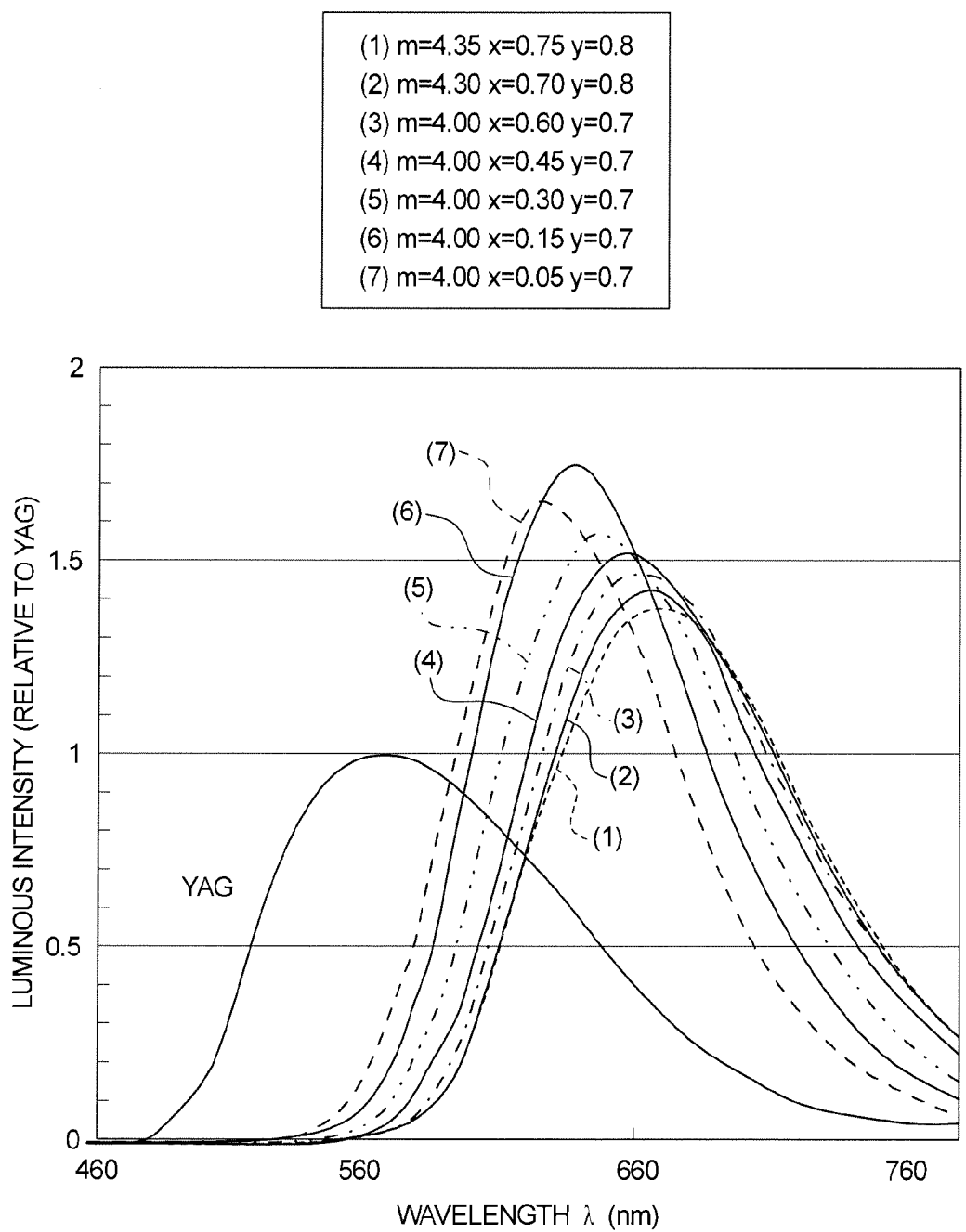
FIG. 1 is a diagram representing an example of emission spectra of red phosphors of an embodiment.

FIG. 1 represents the emission spectra of red phosphors (1) to (7) of the composition formula (1) using strontium (Sr) for element A. For comparison, the emission spectrum of a conventional YAG:Ce phosphor is also presented. Table 1 below presents the optical characteristic values of the red phosphors (1) to (7) of the composition formula (1) taken from the emission spectra of FIG. 1. The measurement values are based on irradiation of 450-nm excitation light with a FLUOROLOG3 (SPEX).

TABLE 1

| Sample No. | Eu concentration (x/m) | Peak wavelength (nm) | Luminous intensity ratio (vs. YAG) | Luminous intensity ratio (vs. YAG) | Chromaticity X | Chromaticity Y |
| --- | --- | --- | --- | --- | --- | --- |
| (1) | 17.228% | 664 | 1.39 | 0.20 | 0.678 | 0.321 |
| (2) | 16.226% | 667 | 1.42 | 0.21 | 0.677 | 0.322 |
| (3) | 15.029% | 662 | 1.48 | 0.22 | 0.677 | 0.323 |
| (4) | 11.175% | 659 | 1.51 | 0.26 | 0.671 | 0.328 |
| (5) | 7.514% | 648 | 1.58 | 0.34 | 0.661 | 0.338 |
| (6) | 3.661% | 636 | 1.74 | 0.47 | 0.648 | 0.351 |
| (7) | 1.156% | 626 | 1.66 | 0.59 | 0.627 | 0.372 |

As can be seen in FIG. 1 and Table 1, the luminous intensity at the peak wavelength is about 1.5 times higher in the red phosphors (1) to (7) of the composition formula (1) range than in the conventional YAG:Ce phosphor. The peak wavelength is 620 nm to 670 nm, showing that desirable red emission is obtained compared with the yellow in the conventional YAG:Ce phosphor.

Particularly desirable red emission is obtained in the vicinity of the peak wavelength 660 nm of the emission spectrum in the red phosphors (1) to (3) of the range $0.5<x<1$ in the composition formula (1).

In the red phosphors (4) to (7) of the range $0<x<0.5$ in the composition formula (1), high luminous intensity emission can be obtained at the peak wavelength of the emission spectrum.

Eu Concentration Dependence of Emission Characteristics

Figure 2:
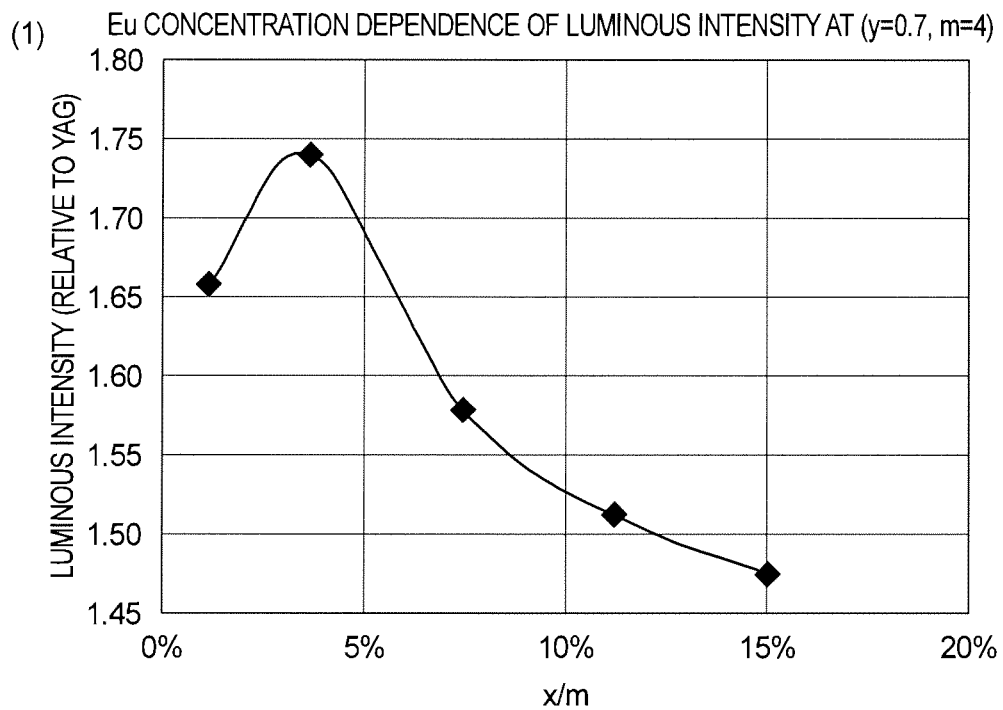
FIG. 2 is a diagram representing the Eu concentration dependence of the emission characteristics of a red phosphor of the embodiment.
Figure 2:
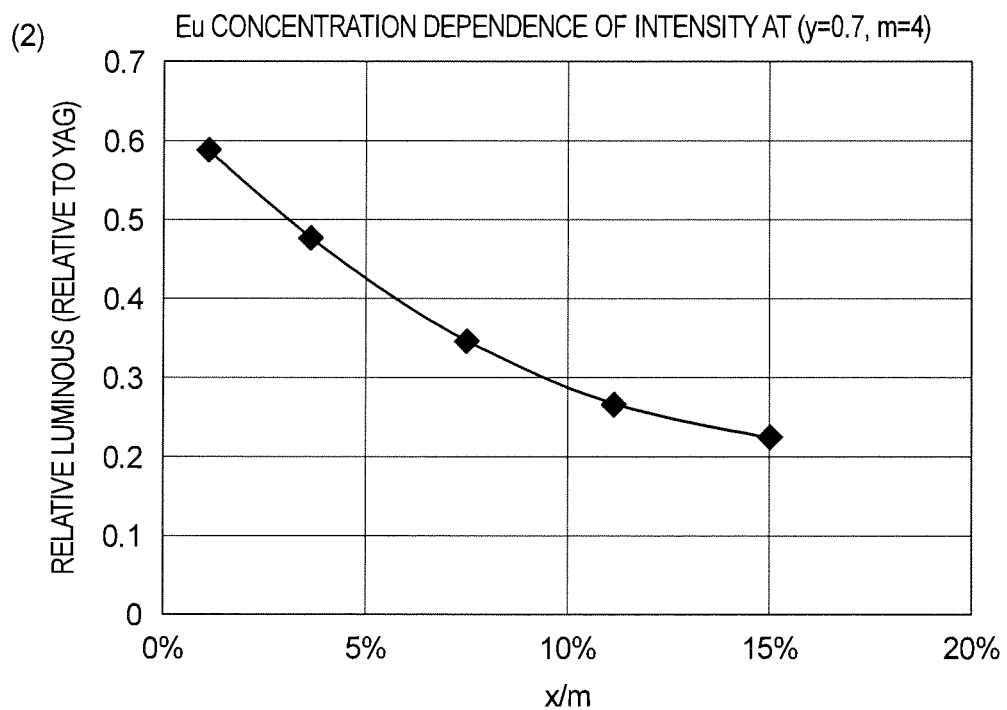

FIG. 2(1) represents the luminous intensity of the red phosphor of the composition formula (1) range as a function of the ratio x/m of m and x in the composition formula (1), relative to the conventional YAG:Ce phosphor. It can be seen from FIG. 2(1) that the red phosphor of composition formula (1) has a luminous intensity peak near x/m=3.75%, demonstrating that the luminous intensity varies with the concentration of europium (Eu). Preferably, x/m≤11% for the red phosphor of composition formula (1), because it yields a luminous intensity 1.5 times higher than that of the conventional YAG:Ce phosphor. It can be seen that the highest luminous intensity can be obtained near x/m=3.75%.

FIG. 2(2) represents the relative luminance of the red phosphor of the composition formula (1) range as a function of the ratio x/m of m and x in the composition formula (1), relative to the conventional YAG:Ce phosphor. It can be seen from FIG. 2(2) that the relative luminance of the red phosphor of composition formula (1) decreases with increase in europium (Eu) concentration, as the emission wavelength peak shifts higher.

Eu Concentration Dependence of Chromaticity

Figure 3:
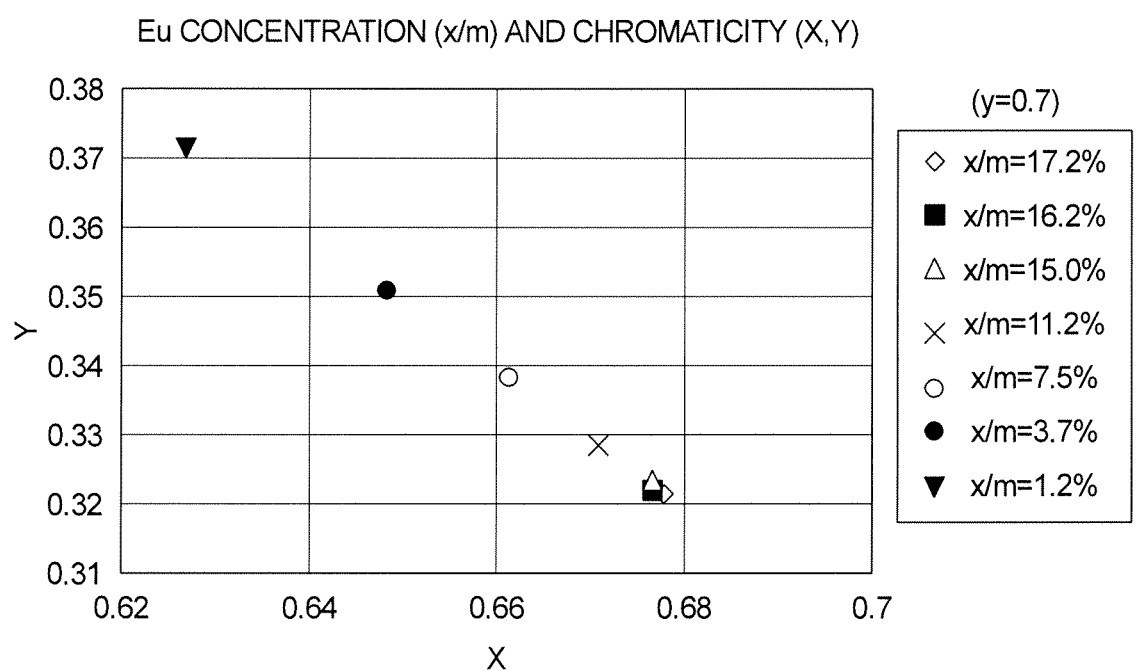
FIG. 3 is a diagram explaining the Eu concentration dependence of the chromaticity (X, Y) of a red phosphor of the embodiment.

FIG. 3 represents the chromaticity (X,Y) of each red phosphor of composition formula (1). The europium (Eu) concentration in each red phosphor was varied by setting a different ratio x/m of m and x within the range of composition formula (1). It can be seen from FIG. 3 that the chromaticity (X,Y) shifts towards the (+X, −Y) side as the relative europium (Eu) concentration with respect to element A [strontium (Sr)] is increased. This demonstrates that the chromaticity of each red phosphor of the composition formula (1) can be controlled by the europium (Eu) concentration with respect to element A [strontium (Sr)].

Al Concentration Dependence of Peak Wavelength

Figure 4:
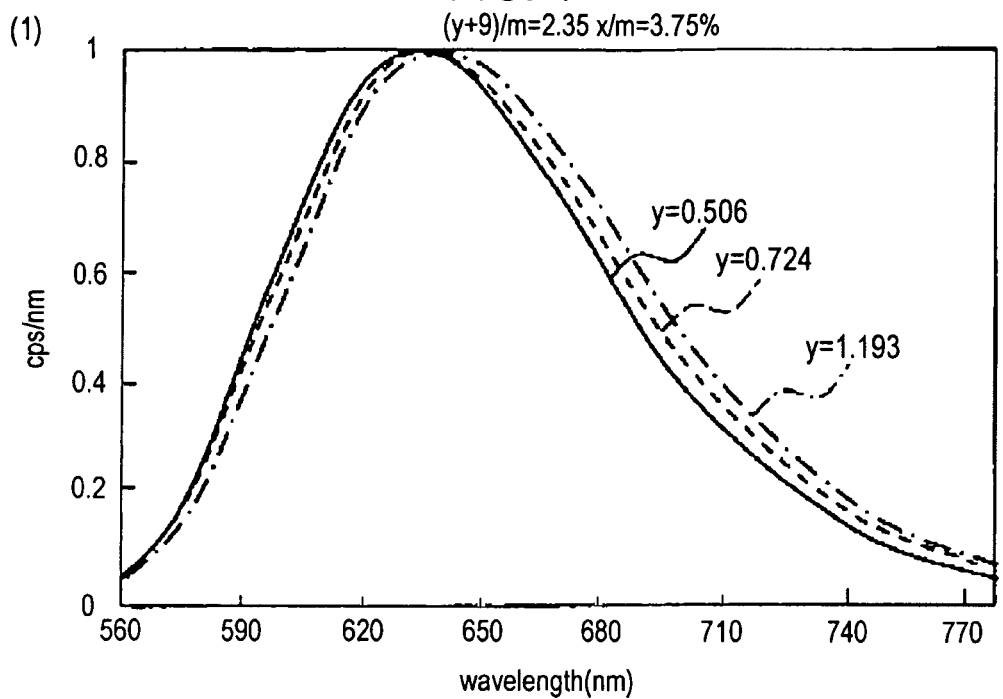
FIG. 4 represents the emission spectrum of each red phosphor of the embodiment after being normalized at the maximum peak=1 cps/nm (part 1).
Figure 4:
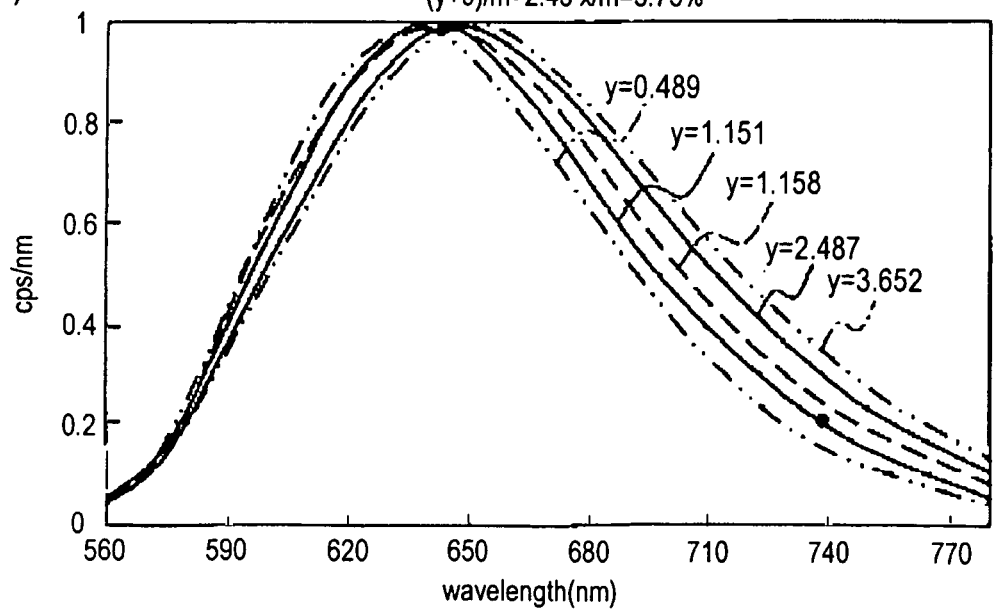
Figure 5:
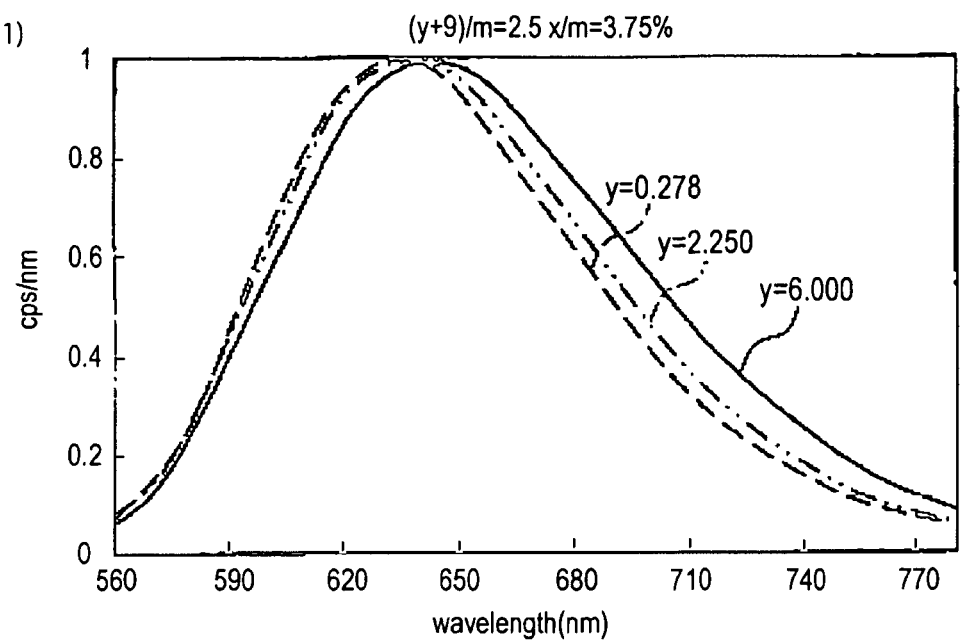
FIG. 5 represents the emission spectrum of each red phosphor of the embodiment after being normalized at the maximum peak=1 cps/nm (part 2).
Figure 5:
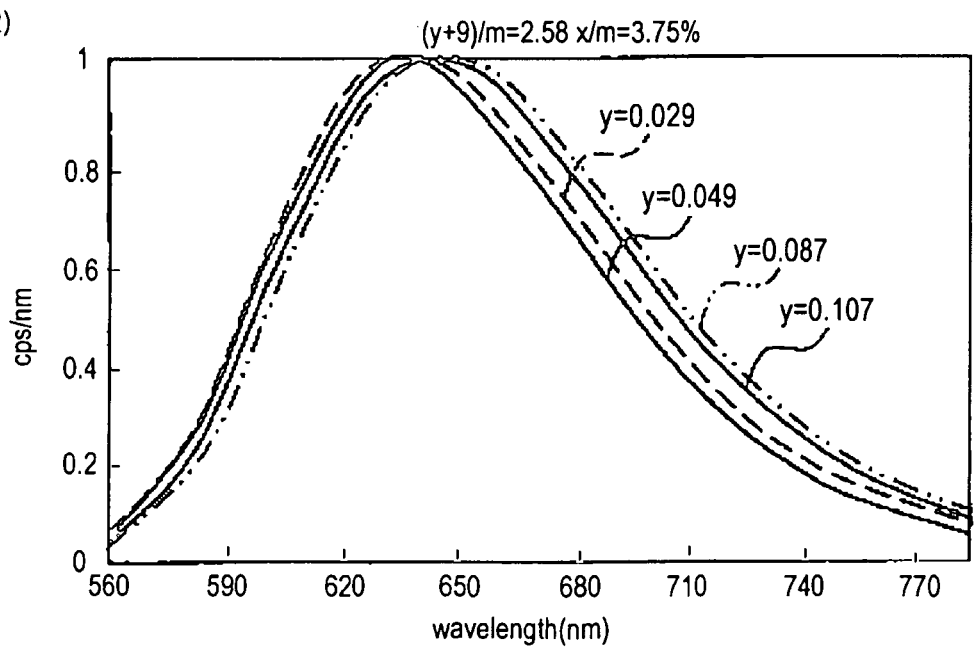

FIGS. 4 and 5 represent the emission spectrum of each red phosphor of composition formula (1). The data have been normalized at the maximum peak=1 cps/nm. The data in FIGS. 4 and 5 represent the emission spectra of the red phosphors of varying atom number ratios y of aluminum (Al) within the range of composition formula (1). For comparison, the data also includes the emission spectrum of a compound whose atom number ratio y of aluminum (Al) falls outside of the range $0<y<2$ of composition formula (1).

It can be seen from the data that the luminous intensity peak of the red phosphor of composition formula (1) tends to shift towards the longer wavelength side as the aluminum (Al) concentration is increased.

Figure 6:
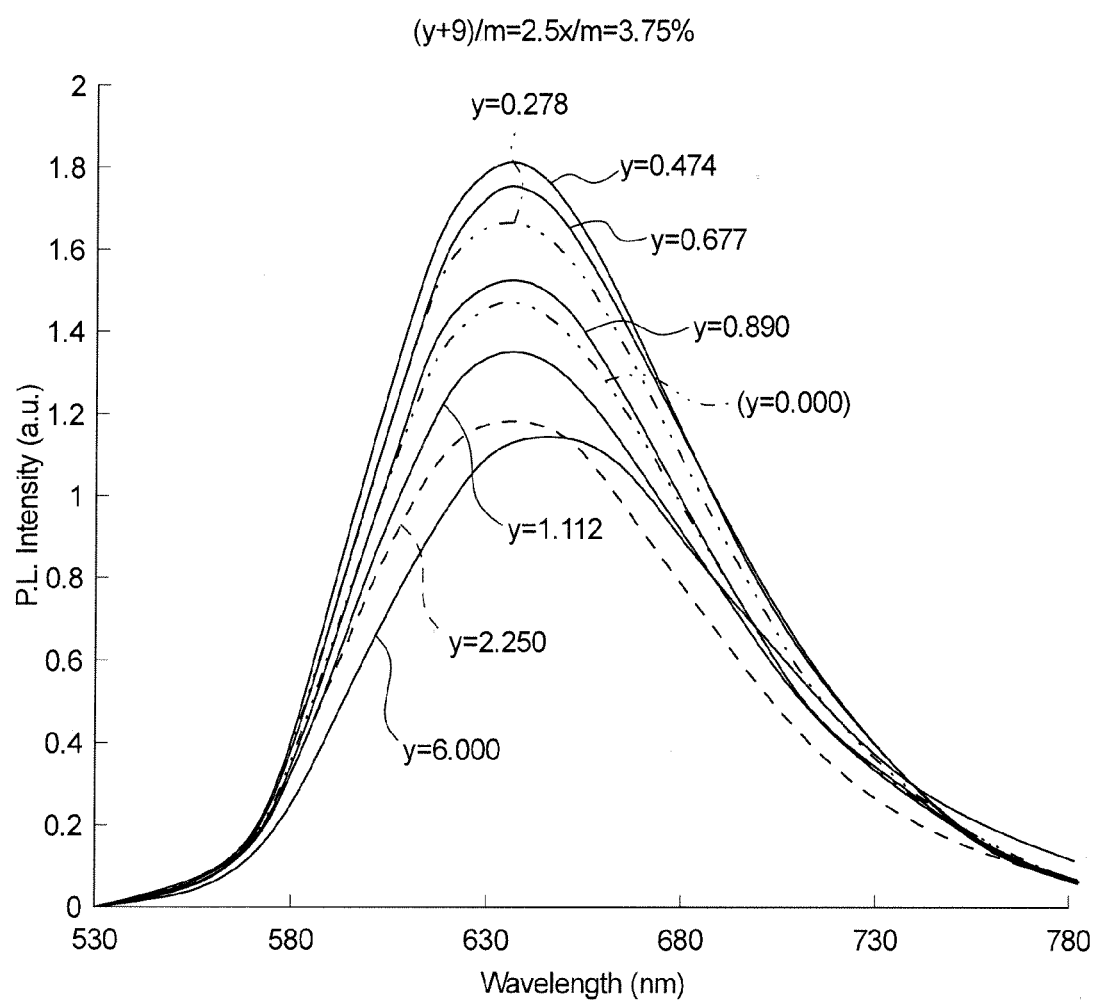
FIG. 6 represents the emission spectrum of each red phosphor at different atom number ratios y of aluminum (Al) in composition formula (1).
Figure 7:
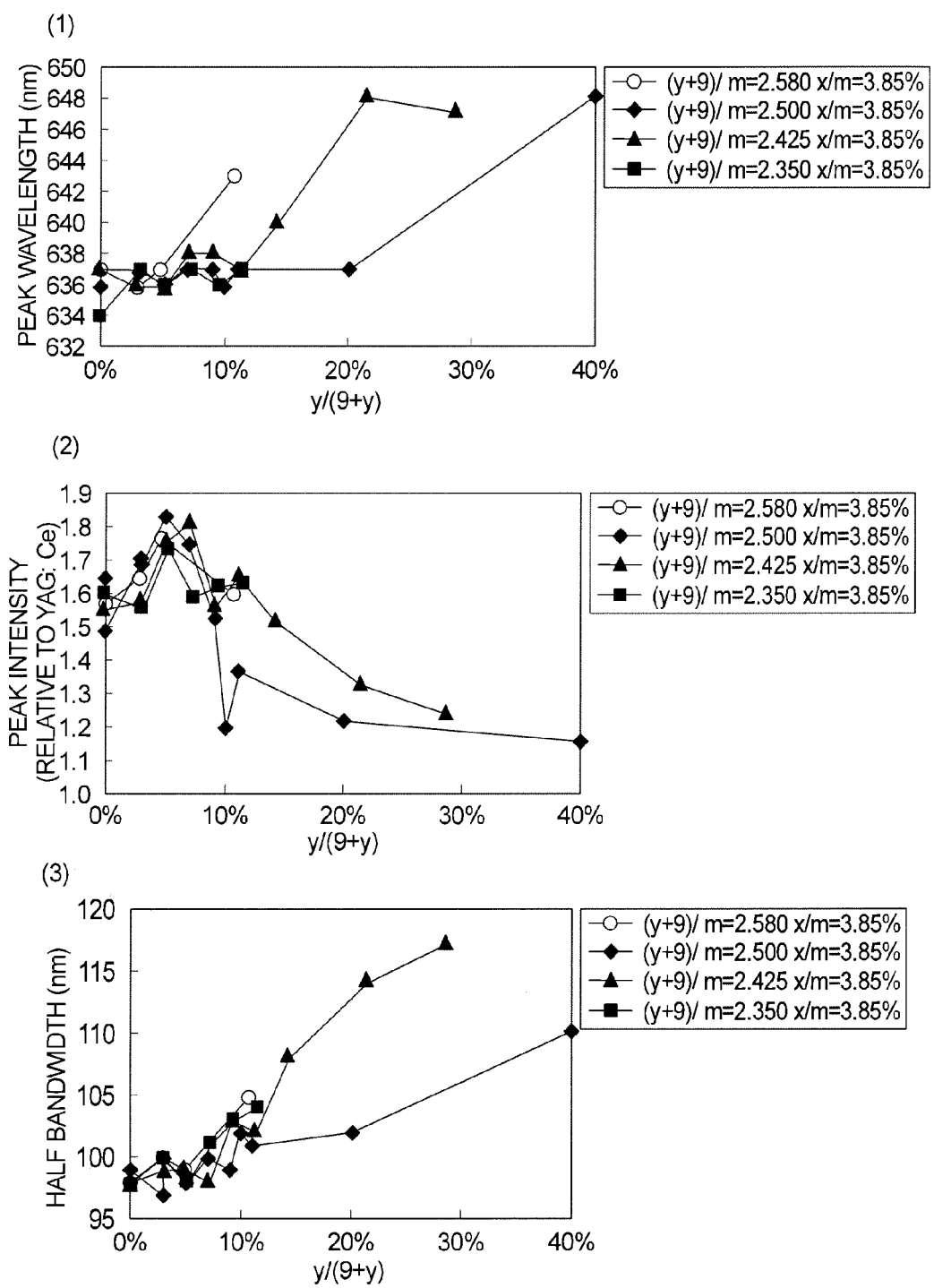
FIG. 7 is a diagram representing optical characteristic values for different aluminum composition ratios [y/(9+y)] with respect to the total composition ratio of silicon (Si) and aluminum (Al) based on FIG. 6.

FIG. 6 represents the emission spectra of red phosphors of varying atom number ratios y of aluminum (Al) in the composition of composition formula (1). For comparison, the data also includes the emission spectrum of a compound whose atom number ratio y of aluminum (Al) falls outside of the range $0<y<2$ of composition formula (1). FIG. 7 represents optical characteristic values at different aluminum composition ratios [y/(9+y)] with respect to the total composition ratio of silicon (Si) and aluminum (Al), based on FIG. 6.

As can be seen from the peak wavelengths in FIG. 7(1), the luminous intensity peak tends to shift towards the longer wavelength side as the aluminum (Al) composition ratio [y/(9+y)], specifically, the aluminum concentration, is increased in the material of composition formula (1).

Further, as can be seen from the peak intensities in FIG. 7(2), the peak intensity is held high at $0<[y/(9+y)]<18.2$, which corresponds to the range $0<y<2$ of the atom number ratio of aluminum in composition formula (1). Specifically, the peak intensity is held high at the range y<2 of the composition formula (1) of the embodiment. It should be noted that samples with lower peaks have large half bandwidths, and high peak intensities are maintained at [y/(9+y)]<18.2, as confirmed by integral values.

Further, as can be seen from the half bandwidths in FIG. 7(3), the half bandwidth of the emission spectrum becomes wider as the aluminum (Al) composition ratio [y/(9+y)], specifically, the aluminum concentration, increases in the material of composition formula (1).

Element A Dependence of Peak Wavelength

Figure 8:
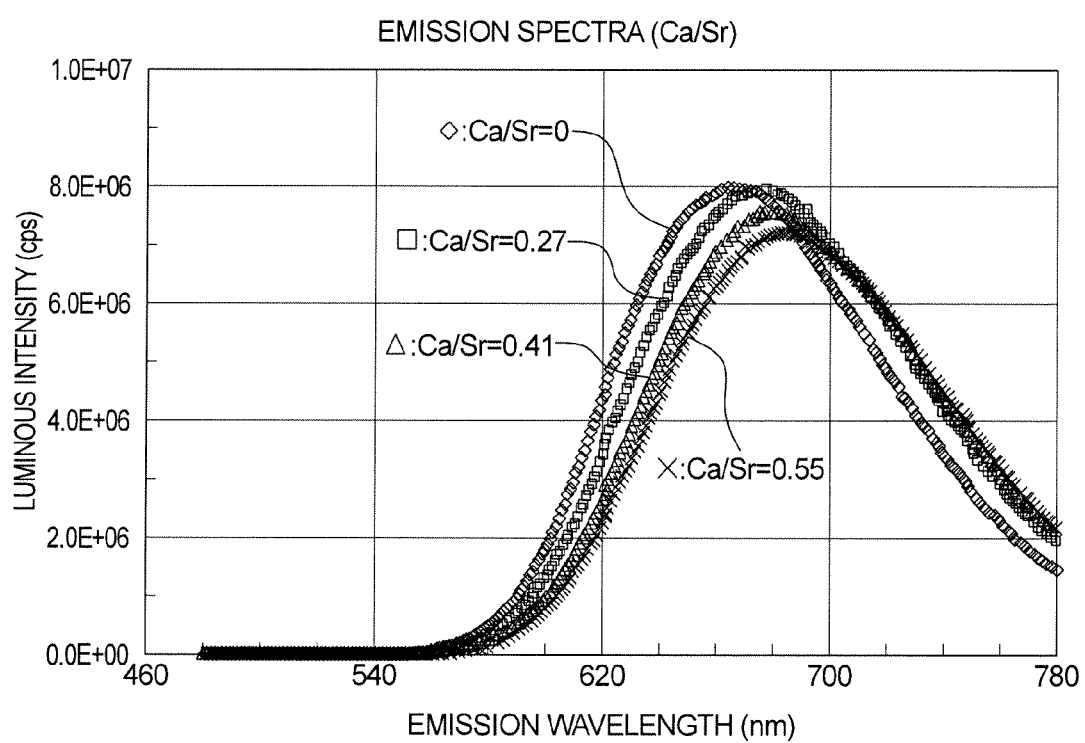
FIG. 8 is a diagram representing the relationship between the calcium content in a red phosphor of the embodiment and luminous intensity.

FIG. 8 represents the emission spectra of red phosphors at varying proportions of strontium (Sr) and calcium (Ca) used for the element A of composition formula (1). As can be seen in FIG. 8, the emission peak wavelength was 664 nm when Ca/Sr=0, specifically, when calcium (Ca) was not contained. The emission peak wavelength was 678 nm at Ca/Sr=0.27, specifically, when the calcium content was 0.27 with respect to the strontium 1. The emission peak wavelength was 679 nm at Ca/Sr=0.41, specifically, when the calcium content was 0.41 with respect to the strontium 1. The emission peak wavelength was 684 nm at Ca/Sr=0.55, specifically, when the calcium content was 0.55 with respect to the strontium 1.

As demonstrated above, when calcium (Ca) is contained as element A in the composition formula (1), the emission peak wavelength of the red phosphor represented by the composition formula (1) can be shifted towards the longer wavelength side by increasing the calcium (Ca) content.

Temperature Characteristics

Figure 9:
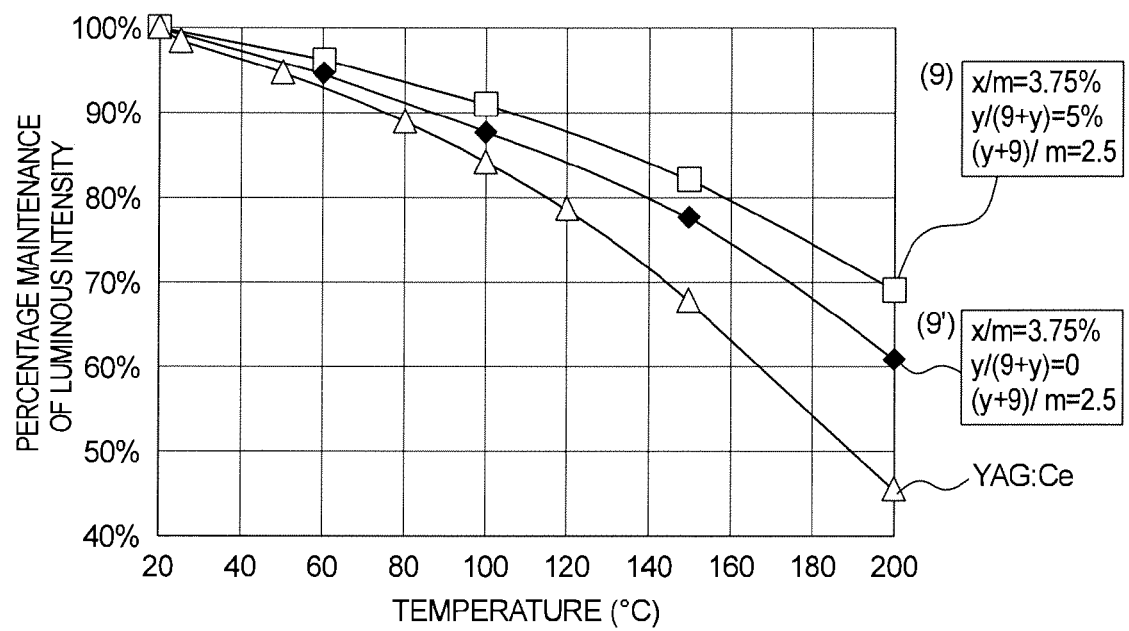
FIG. 9 is a diagram representing the temperature characteristics of red phosphors produced in Examples.

FIG. 9 represents the temperature characteristic of red phosphor (9) of composition formula (1). For comparison, the figure also presents the temperature characteristic of phosphor (9') that does not contain aluminum (y=0; outside the range of composition formula (1)), and the temperature characteristic of a conventional YAG:Ce phosphor.

As can be seen from FIG. 9, the percentage maintenance of luminous intensity under heating conditions is higher in the red phosphor of composition formula (1) than in the aluminum-free phosphor (9') and the conventional YAG:Ce phosphor, showing that the red phosphor of composition formula (1) has a more desirable temperature characteristic.

This result can be explained by the lack of the hydrolysis that occurs in the conventional sulfide red phosphor, and by the presence of aluminum (Al) in the crystal structure. Specifically, the result appears to be linked to the increased distance between the europium (Eu) atoms as a result of elongated c axis following the replacement of the silicon (Si) with Al in the crystal structure that belongs to the orthorhombic system spatial point group Pmn21 represented by composition formula (1).

Other

The red phosphor of composition formula (1) may contain carbon (C). The carbon (C) is an element that originates in the raw material of the red phosphor producing process, and may be left over in the synthesized material forming the red phosphor, without being removed during the synthesis. The carbon (C) serves to remove the excess oxygen (O) in the process, and thus to adjust the oxygen amount.

Variation 1 of Red Phosphor

In the red phosphor, selenium (Ce) may be used instead of the europium (Eu) in the composition formula (1). In this case, the red phosphor contains the charge-compensating lithium (Li), sodium (Na), and potassium (K) atoms, in addition to the selenium (Ce).

Variation 2 of Red Phosphor

In the foregoing First Embodiment, the red phosphor was described as the compound of composition formula (1) that contains aluminum. However, a variation of the red phosphor may be, for example, an aluminum-free compound that contains silicon, strontium, europium, nitrogen, and oxygen. Such a compound is represented by the following composition formula (2).

$[Sr_{(m-x)}Eu_x]Si_9O_nN_{[12-2(n-m)/3]}$     Composition Formula (2)

In the composition formula (2), x, m, and n satisfy the relations $0.5<x<1.0$, $3.5<m<4.0$, and $0<n<13.0$.

Note that the atom number ratio $[12+y-2(n-m)/3]$ of the nitrogen (N) in the composition formula (2) is calculated so that the sum of the atom number ratio of each element in the composition formula (2) is neutralized.

The red phosphor of composition formula (2) may contain calcium (Ca). By increasing the content of calcium with respect to strontium, the emission peak wavelength of the red phosphor of composition formula (2) can be shifted towards the longer wavelength side.

Further, the red phosphor of composition formula (2) may contain carbon. The carbon serves to remove the excess oxygen (O) in the process, and thus to adjust the oxygen amount.

The red phosphor of composition formula (2) has the same effects as the red phosphor of composition formula (1), and additionally provides better ease of handling owing to the fewer constituent elements. Another advantage is the simpler crystal structure, and thus fewer defects. However, the red phosphor of composition formula (1) has superior heat resistance, as described with reference to FIG. 9.

2. Second Embodiment (Red Phosphor Producing Method)

An embodiment of a method of production of the red phosphor of composition formula (1) is described below with reference to the flowchart of FIG. 4.

As represented in FIG. 3, a raw material mixing step S1 is performed first. The characteristic feature of the raw material mixing step is that the raw material melamine ($C_3H_6N_6$) is used and mixed with the raw material compounds that contain the constituent elements of composition formula (1).

The raw material compounds containing the constituent elements of composition formula (1) are prepared as the carbonate compound of element A [for example, strontium carbonate ($SrCO_3$)], europium nitride (EuN), silicon nitride ($Si_3N_4$), and aluminum nitride (AlN). Each compound is then weighed in a predetermined molar ratio, so that the composition formula (1) element contained in each raw material compound has the atom number ratio of composition formula (1). After being weighed, the compounds are mixed to produce a mixture.

The melamine is added under the flux at a predetermined proportion with respect to the sum of the total number of moles of the strontium carbonate, europium nitride, silicon nitride, and aluminum nitride (AlN).

The mixture is produced, for example, by mixing the compounds in an agate mortar, inside a glow box placed in a nitrogen atmosphere.

Thereafter, a first heat-treatment step S2 is performed. In the first heat-treatment step, the mixture is calcined to produce a first calcined product as a precursor of the red phosphor. For example, the mixture is subjected to heat treatment in a hydrogen ($H_2$) atmosphere inside a boron nitride crucible. The first heat-treatment step involves, for example, a 2-hour heat treatment at a temperature of 1,400° C. The heat treatment temperature and the heat treatment time can be appropriately varied, as long as the mixture is calcined.

In the first heat-treatment step, the melamine, with the melting point of 250° C. or less, undergoes pyrolysis. The pyrolysis produces carbon (C) and hydrogen (H), which bind to some of the oxygen (O) atoms contained in the strontium carbonate, and form a carbon oxide gas (CO or $CO_2$) or $H_2O$. The carbon oxide gas (CO or $CO_2$) or $H_2O$ evaporates, and are removed from the first calcined product. The nitrogen (N) contained in the decomposed melamine promotes reduction and nitridation.

The next step is a first pulverizing step S3. In the first pulverizing step, the first calcined product is pulverized to produce a first powder. For example, the first calcined product is pulverized in a glow box placed in a nitrogen atmosphere, using an agate mortar, and passed through, for example, a #100 mesh (opening size of about 200 µm) to obtain a first calcined product having an average particle size of 3 µm or less. This helps suppress nonunifoimity in the components of a second calcined product produced in the next second heat treatment step.

Then, a second heat-treatment step S4 is performed. In the second heat-treatment step, the first powder is subjected to heat treatment to produce a second calcined product. For example, the first powder is subjected to heat treatment in a nitrogen ($N_2$) atmosphere inside a boron nitride crucible. In the second heat-treatment step, the heat treatment is performed for, for example, 2 hours under the pressurized nitrogen atmosphere of 0.85 MPa, and at the heat treatment temperature of 1,800° C. The heat treatment temperature and heat treatment time can be appropriately varied, as long as the first powder is calcined.

As a result of the second heat-treatment step, the red phosphor of composition formula (1) is obtained. The second calcined product (red phosphor) obtained in the second heat-treatment step is a homogeneous product according to composition formula (1).

The next step is a second pulverizing step S5. In the second pulverizing step, the second calcined product is pulverized to produce a second powder. For example, the second calcined product is pulverized in a glow box placed in a nitrogen atmosphere, using an agate mortar, followed by pulverization to make the average particle size, for example, about 3.5 µm, using, for example, a #420 mesh (opening size of about 26 µm).

By the red phosphor producing method, a fine powder (for example, an average particle size of about 3.5 µm) of red phosphor is obtained. By thus forming the red phosphor in the form of a powder, the red phosphor can be uniformly kneaded into a transparent resin with, for example, a green phosphor powder.

As a result, the red phosphor of composition formula (1) is obtained that contains each element mixed at the atom number ratio of the raw material mixing step S1.

Variation of Red Phosphor Producing Method

The producing method described with reference to the flowchart of FIG. 4 is also, applicable to the producing method of the red phosphor as the aluminum (Al)-free compound of composition formula (2).

In the producing method (second producing method), a mixture of strontium carbonate, silicon nitride, europium nitride, and melamine is produced, and the mixture is calcined to produce a precursor of the red phosphor. Here, the melamine is decomposed, and the carbon and hydrogen contained therein bind to the oxygen in the strontium carbonate, forming, for example, carbon oxide gas or $H_2O$, and thus removing some of the oxygen atoms in the strontium carbonate.

The first calcined product is then pulverized to produce a first powder, which helps suppress nonuniformity in the components of the second calcined product produced in the next second heat-treatment step.

The first powder is then subjected to heat treatment to produce a second calcined product. The second calcined product (red phosphor) obtained in the second heat-treatment step is therefore a homogenous product according to the composition formula (2).

The second calcined product is further pulverized to produce a second powder. By forming the red phosphor in the form of a powder, the red phosphor can be uniformly kneaded into a transparent resin with, for example, a green phosphor powder.

The red phosphor obtained after these steps has a peak emission wavelength in the red waveband (for example, a 640 nm to 770 nm waveband), as will be described in Examples.

By excluding aluminum nitride from the raw material, ease of handling improves owning to the fewer constituent elements. Another advantage is the simpler crystal structure, and thus fewer defects.

3. Third Embodiment (Exemplary Configuration of White Light Source)

An embodiment of a white light source is described below with reference to the schematic cross sectional view of FIG. 11.

Figure 11:
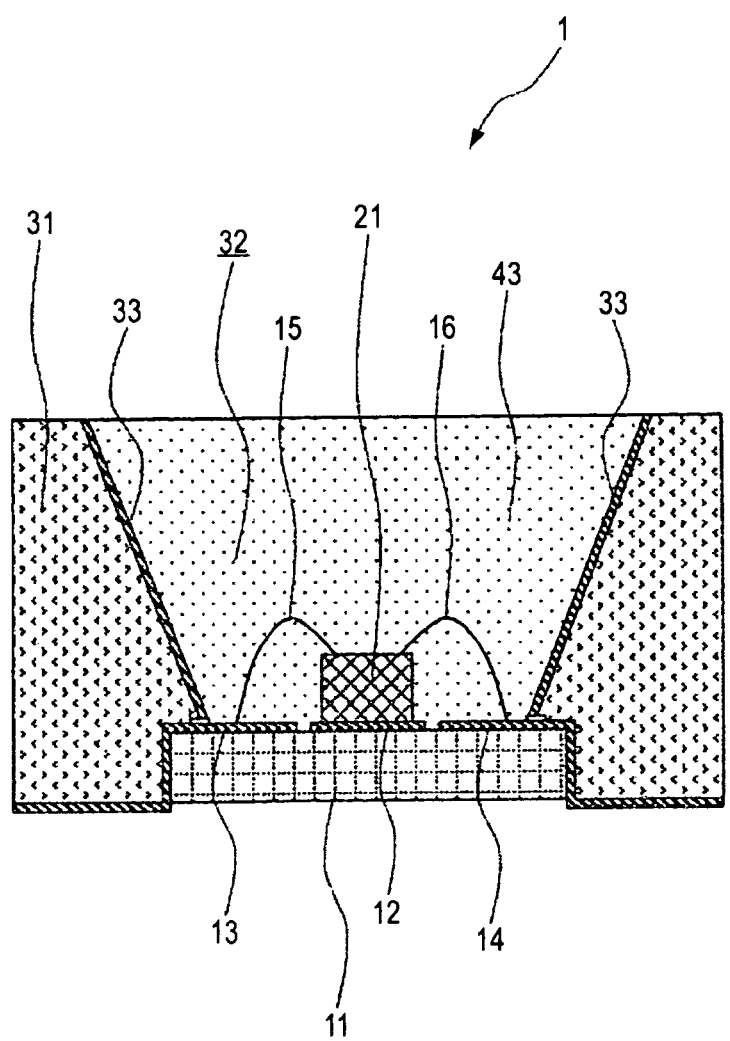
FIG. 11 is a schematic cross sectional view representing an embodiment of a white light source of the embodiment.

As illustrated in FIG. 11, a white light source 1 includes a blue-emitting diode 21 on a pad portion 12 formed on an element substrate 11. Electrodes 13 and 14 that supply driving power to the blue-emitting diode 21 are formed on the element substrate 11 by being insulated from the element substrate 11. The electrodes 13 and 14 are connected to the blue-emitting diode 21, for example, via leads 15 and 16, respectively.

For example, a resin layer 31 is provided around the blue-emitting diode 21. The resin layer 31 has an aperture 32 for the blue-emitting diode 21. The aperture 32 has a slant face forming an aperture area that becomes wider along the emission direction of the blue-emitting diode 21. A reflecting film 33 is formed on the slant face. Specifically, the reflecting film 33 covers the wall surface of the aperture 32 having a form of a mortar in the resin layer 31, and the blue-emitting diode 21 is disposed on the bottom surface of the aperture 32. A kneaded product 43 as a kneaded product of a red phosphor and a green phosphor in a transparent resin is embedded in the aperture 32, covering the blue-emitting diode 21 to form the white light source 1.

A characteristic feature of the white light source 1 is that the red phosphor of composition formula (1) of the present invention is used as the red phosphor.

As an example of the red phosphor, a compound of the composition formula $(Sr_{3.4}Eu_{0.7})Si_9Al_{0.7}O_{0.7}N_{15}$ using strontium (Sr) as the element A of the composition formula (1) was used, where m=4.1, x=0.7, y=0.7, and n=0.7.

As the green phosphor, a compound of the composition formula $(Sr,Ba)_2SiO_4$:Eu was used, for example.

The kneaded product 43 was made by kneading 0.015 g of the red phosphor and 0.45 g of the green phosphor in a silicone resin. For example, the product Silicone KJR637 (refractive index 1.51) from Shin-Etsu Chemical Co., Ltd. was used as the silicone resin. The characteristics of the white light source 1 fabricated as above are as follows.

Current value=40 mA, and current density=327 $mA/mm^2$ under applied voltage of 3.235 V to the blue-emitting diode 21. The optical characteristics are as follows. Radiant flux=31.1 mW, WPE=0.240, Lms=6.8, lm/W=52.7, chromaticity (x)=0.2639, and chromaticity (y)=0.2639. WPE denotes the energy efficiency, Lms the lumen:luminous flux, and lm/W the emission efficiency.

Figure 12:
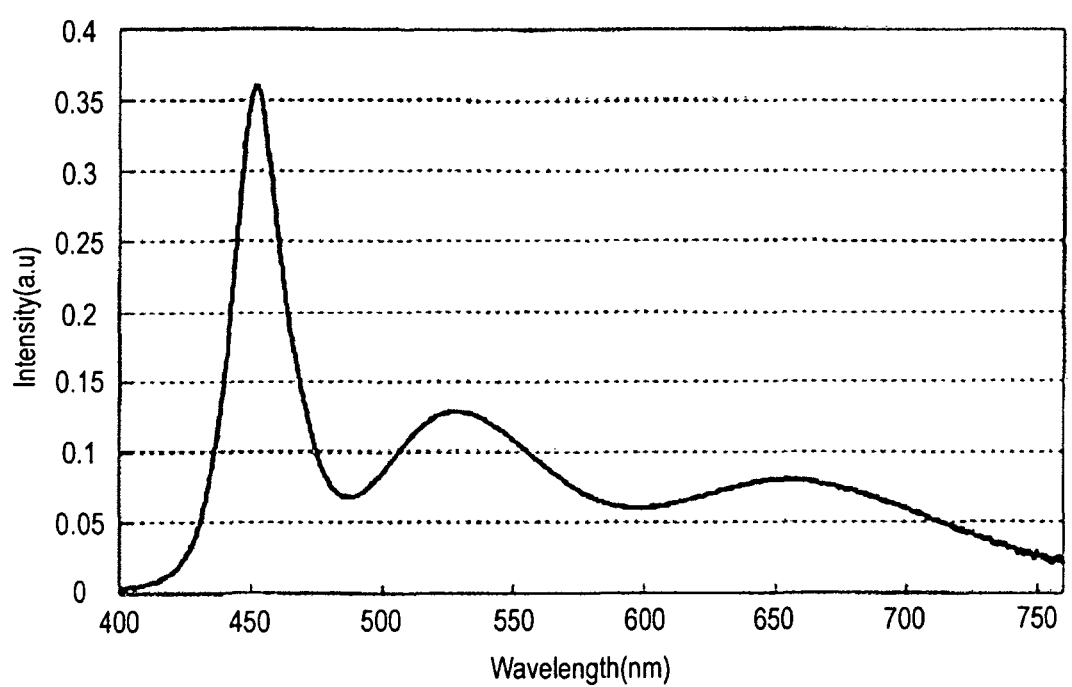
FIG. 12 is a diagram representing an example of an emission spectrum of a white light source of the embodiment.

The emission spectrum had blue (450 nm), green (534 nm), and red (662 nm) wavelength peaks, as represented in FIG. 12.

As described above, the red phosphor of the present invention has a peak emission wavelength in the red waveband (for example, 640 nm to 770 nm waveband), and thus has strong luminous intensity and high luminance. As a result, bright white light of three primary colors including the blue light by the blue LED, the green light by the green phosphor, and the red light by the red phosphor can be obtained.

The white light source 1 therefore advantageously produces bright white light with a wide color gamut.

4. Fourth Embodiment (Exemplary Configuration of Illuminating Device)

An embodiment of an illuminating device is described below with reference to the schematic plan view of FIG. 13.

Figure 13:
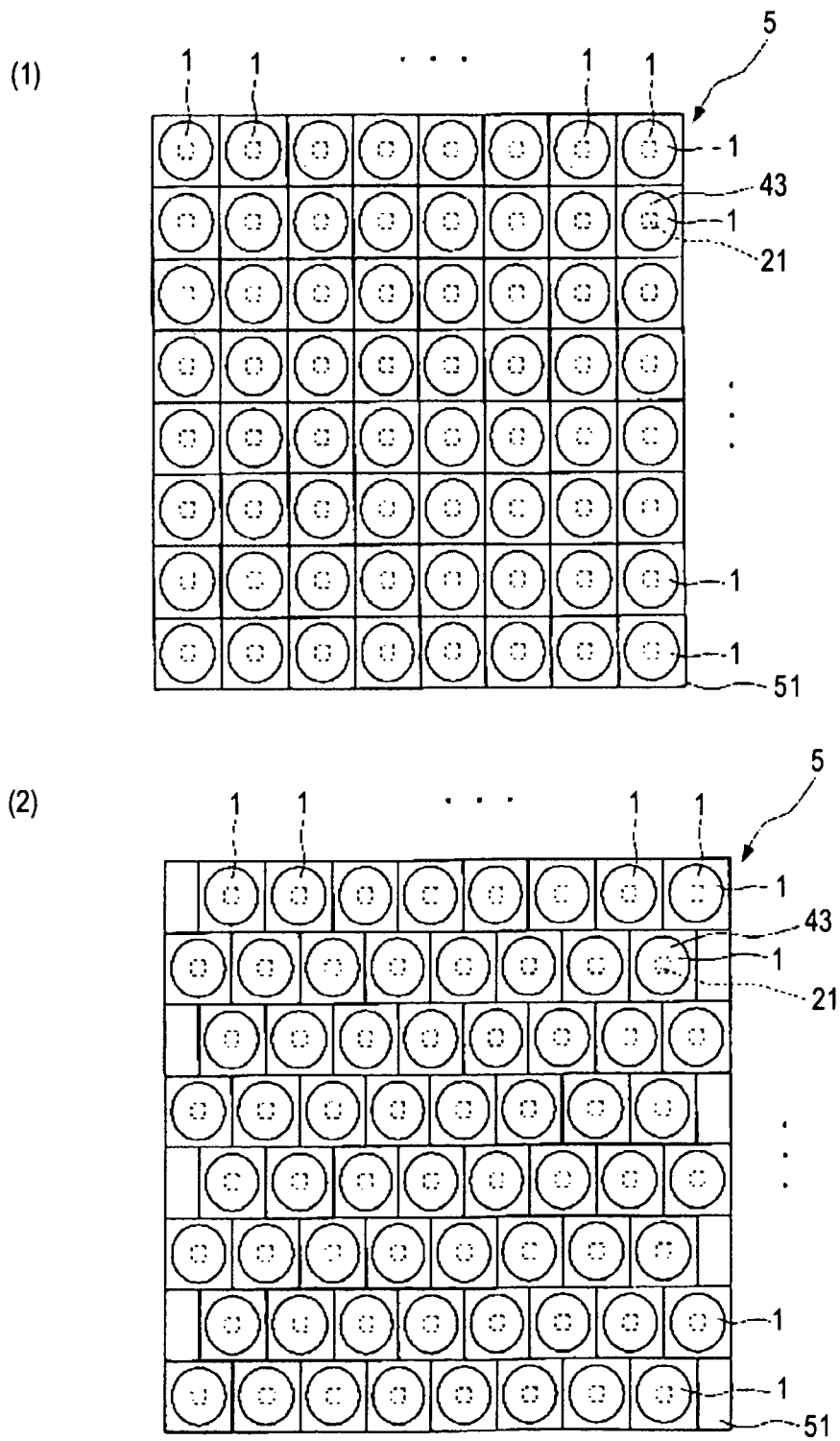
FIG. 13 is a schematic plan view representing an embodiment of an illuminating device of the embodiment.

As illustrated in FIG. 13, an illuminating device 5 includes a plurality of white light sources 1 on an illumination substrate 51. The white light source 1 is that described in FIG. 11. The white light sources 1 may be disposed, for example, in a square grid array as in FIG. 13(1), or each row may be shifted, for example, 1/2 pitch, as illustrated in FIG. 13(2). The shift pitch is not limited to 1/2, and may be 1/3 or 1/4. The shift may occur row by row, or in units of plural rows (for example, two rows).

Alternatively, each column may be shifted, for example, 1/2 pitch, though not illustrated. The shift pitch is not limited to 1/2, and may be 1/3 or 1/4. The shift may occur row by row, or in units of plural rows (for example, two rows).

In other words, the white light sources 1 may be shifted in any ways.

The white light sources 1 have the configuration described with reference to FIG. 11. Specifically, the white light sources 1 include the kneaded product 43 of the red phosphor and the green phosphor in a transparent resin on the blue-emitting diode 21.

A characteristic feature of the white light sources 1 is that the red phosphor of composition formula (1) of the embodiment is used as the red phosphor.

Because of the white light sources 1 substantially equivalent of point emission are horizontally and vertically disposed on the illumination substrate 51, the illuminating device 5 becomes equivalent of surface emission. This enables the illuminating device 5 to be used as the backlight of, for example, a liquid crystal display device. The illuminating device 5 also can be used as a wide variety of illuminating devices, including ordinary illuminating devices, illuminating devices for shooting, and illuminating devices for construction sites.

Because the white light source 1 of the present invention is used, the illuminating device 5 can produce bright white light with a wide color gamut. For example, when used as the backlight of a liquid crystal display device, the illuminating device 5 can advantageously provide high-luminance pure white on a display screen, and thus improves the display screen quality.

5. Fifth Embodiment (Exemplary Configuration of Liquid Crystal Display Device)

An embodiment of a liquid crystal display device is described below with reference to the schematic block diagram of FIG. 14.

Figure 14:
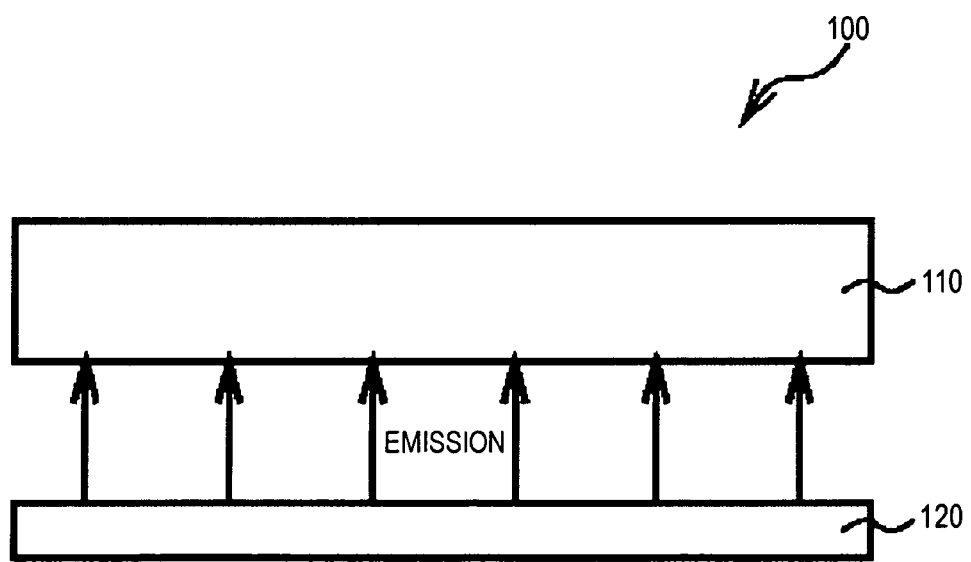
FIG. 14 is a schematic block diagram representing an embodiment of a liquid crystal display device of the embodiment.

As illustrated in FIG. 14, a liquid crystal display device 100 includes a liquid crystal display panel 110 having a transmission display portion, and a backlight 120 provided on the back side of the liquid crystal display panel 110 (the surface opposite the display face). The illuminating device 5 described with reference to FIG. 13 is used as the backlight 120.

Because the illuminating device 5 of the embodiment is used as the backlight 120, the liquid crystal display panel 110 of the liquid crystal display device 100 can be shone upon by the wide color-gamut, bright white light of the three primary colors. Thus, high-luminance pure white can be obtained on the display screen of the liquid crystal display panel 110, advantageously providing desirable color reproducibility and improving display screen quality.

EXAMPLES

Example 1

Figure 10:
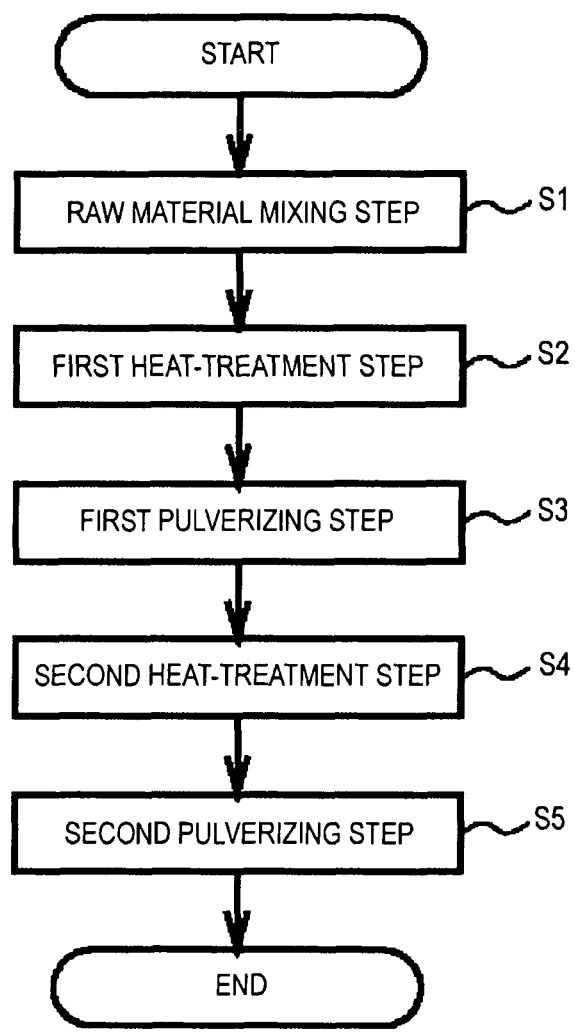
FIG. 10 is a flowchart representing an embodiment of a red phosphor producing method of the embodiment.

A red phosphor of composition formula (1), and a compound (phosphor) outside of the composition formula (1) were synthesized in Example 1 of the embodiment and in Comparative Example, respectively, according to the procedure described with reference to the flowchart of FIG. 10, as follows.

First, the raw material mixing step S1 was performed. Here, strontium carbonate ($SrCO_3$), europium nitride (EuN), silicon nitride ($Si_3N_4$), aluminum nitride (AlN), and melamine ($C_3H_6N_6$) were prepared. Each raw material compound prepared as above was weighed at the molar ratio presented in Table 2 below, and was mixed in a glow box placed in a nitrogen atmosphere, using an agate mortar. It should be noted that the molar ratio of melamine is the percentage with respect to the sum of the total number of moles of the other compounds.

TABLE 2

| Sample No. | $SrCO_3$ (mol %) | EuN (mol %) | $Si_3N_4$ (mol %) | AlN (mol %) | Melamine (mol %) | Composition |
|---|---|---|---|---|---|---|
| (1) | 44.2% | 9.2% | 36.8% | 9.8% | 60% | m = 4.35, x = 0.75, y = 0.8 |
| (2) | 44.4% | 8.6% | 37% | 9.9% | 60% | m = 4.30, x = 0.70, y = 0.8 |
| (3) | 44/1% | 7.8% | 39% | 9.1% | 60% | m = 4.00, x = 0.60, y = 0.7 |
| (4) | 46.1% | 5.8% | 39% | 9.1% | 60% | m = 4.00, x = 0.45, y = 0.7 |
| (5) | 48% | 3.9% | 39% | 9.1% | 60% | m = 4.00, x = 0.30, y = 0.7 |
| (6) | 50% | 1.9% | 39% | 9.1% | 50% | m = 4.00, x = 0.15, y = 0.7 |
| (7) | 51.3% | 0.6% | 39% | 9.1% | 50% | m = 4.00, x = 0.05, y = 0.7 |

Next, the first heat-treatment step S2 was performed. Here, the mixture was placed in a boron nitride crucible, and a 2-hour heat treatment was performed in a hydrogen ($H_2$) atmosphere at 1,400° C.

This was followed by the first pulverizing step S3. Here, the first calcined product was pulverized in a glow box placed in a nitrogen atmosphere, using an agate mortar, and passed through a #100 mesh (opening size of about 200 µm), so as to obtain the first calcined product having an average particle size of 3 µM or less.

Next, the second heat-treatment step S4 was performed. Here, the powder of the first calcined product was placed in a boron nitride crucible, and a 2-hour heat treatment was performed in a 0.85-MPa nitrogen ($N_2$) atmosphere at 1,800° C. As a result, the second calcined product was obtained.

This was followed by the second pulverizing step S5, in which the second calcined product was pulverized in a glow box placed in a nitrogen atmosphere, using an agate mortar. The second calcined product was pulverized to make the average particle size about 3.5 μM, using a #420 mesh (opening size of about 26 μm).

By the red phosphor producing method, a fine powder of red phosphor (for example, an average particle size of about 3.5 μm) was obtained.

The red phosphor produced as above was analyzed by ICP. The analysis confirmed that each constituent element of the composition formula (1) in the red phosphor was contained at almost the same molar ratio (atom number ratio) as that in the raw material compound. It was also confirmed that the red phosphor of the composition formula (1) was obtained as presented in Table 2. Note that the red phosphors with the sample numbers (1) to (7) produced in Example 1 are the red phosphors (1) to (7) presented in Table 1 and in FIG. 1. The red phosphors (1) to (7) of the composition formula (1) range had the peak-wavelength luminous intensity about 1.5 times higher than that of the conventional YAG:Ce phosphor, and produced desirable red emission, as described with reference to FIG. 1.

Example 2

In Example 2, a red phosphor of the composition $Sr_{3.4}Eu_{0.7}Si_9Al_{0.7}O_{0.7}N_{10}$ (m=4.1, x=0.7, y=0.7, n=0.7) as an example of the composition formula (1) was produced according to the procedure described in Example 1. Note that, in Example 2, the composition ratio 10 of the nitrogen is not in accord with the [12+y−2(n−m)/3] of composition formula (1). This is due to the poor reliability of the measured oxygen and nitrogen concentration values by the ICP analysis. ICP analysis, however, is highly reliable with regard to Sr, Eu, Si, and Al measurements, and, considering the charge compensation based on the Sr, Eu, Si, and Al values, the result for the composition of the composition formula (1) is unquestionable.

Figure 15:
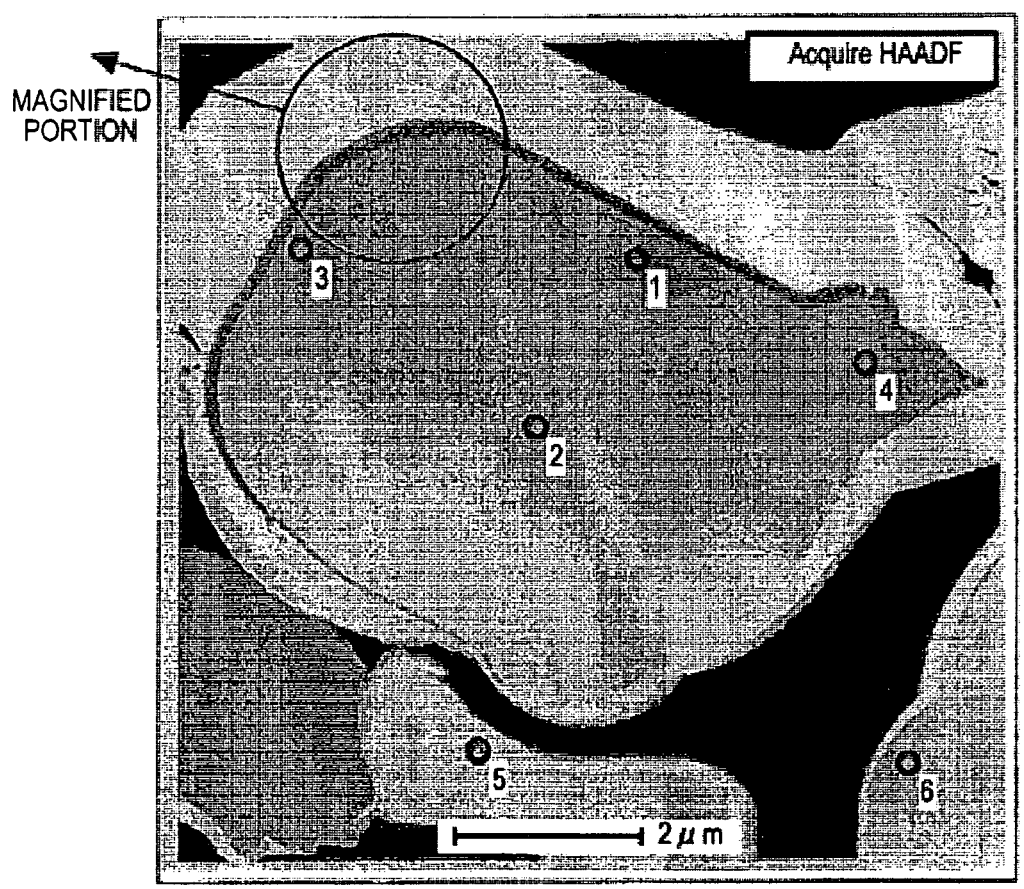
FIG. 15 is an HAADF-STEM image of a red phosphor produced in an Example.
Figure 16:
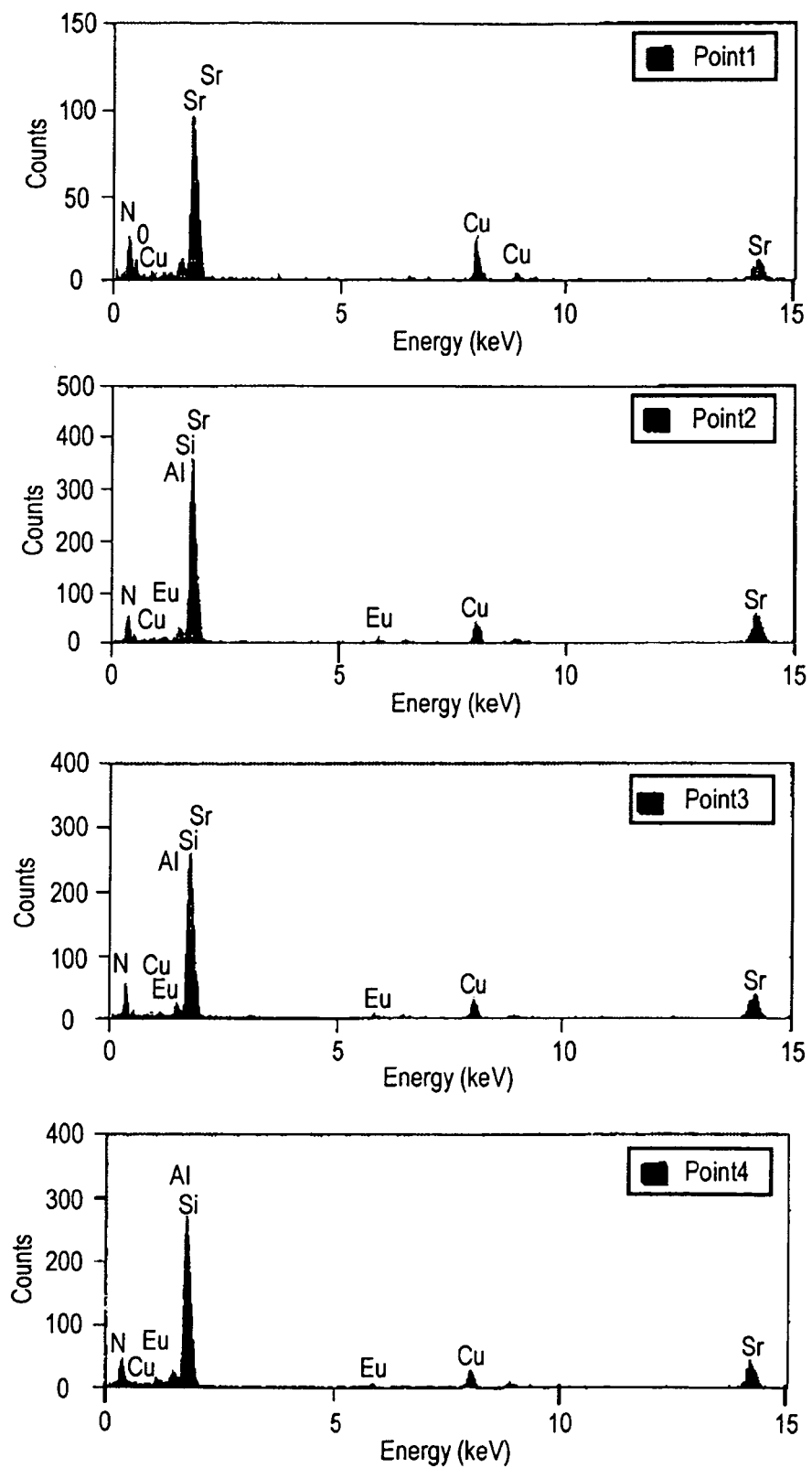
FIG. 16 represents a TEM-EDX analysis spectrum at each point of the red phosphor produced in the Example.
Figure 17:
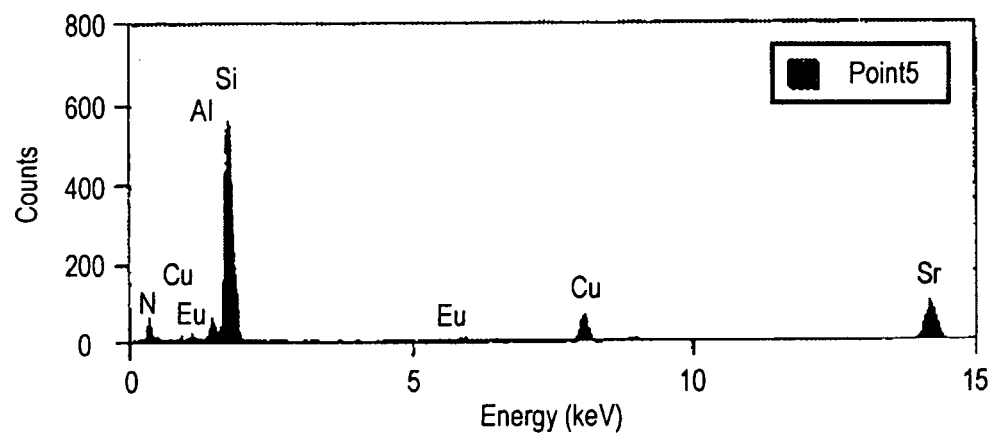
FIG. 17 represents a TEM-EDX analysis spectrum at each point of the red phosphor produced in the Example.
Figure 17:
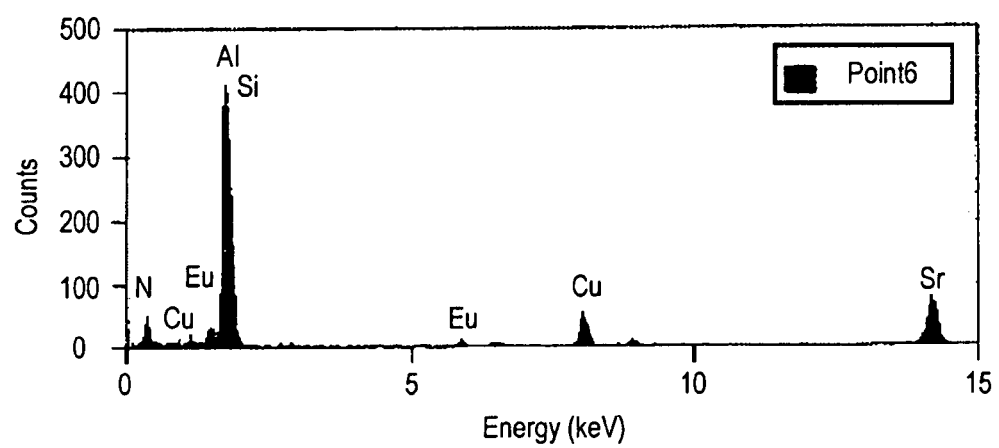

TEM-EDX analysis was performed for the red phosphors produced as above. FIG. 15 shows an HAADF-STEM image with the analysis points in a red phosphor particle. As shown in FIG. 15, TEM-EDX analysis was performed at six locations, including points 1 to 4 within the same particle, and points 5 and 6 in another particle. FIGS. 16 and 17 present the results.

From the observation that the HAADF-STEM image in FIG. 15 had a uniform contrast, and that there was no large difference in the EDX profile for the points 1 to 4 in the same particle as presented in FIG. 16, it was conformed that the element composition, including aluminum (Al), had no bias within the particle, and was substantially uniform. Further, as presented in FIG. 17, the EDX profile did not greatly differ in another particle, and formation of particles with substantially uniform composition ratios was confirmed. Note that copper (Cu) was detected because of the TEM stage.

Figure 18:
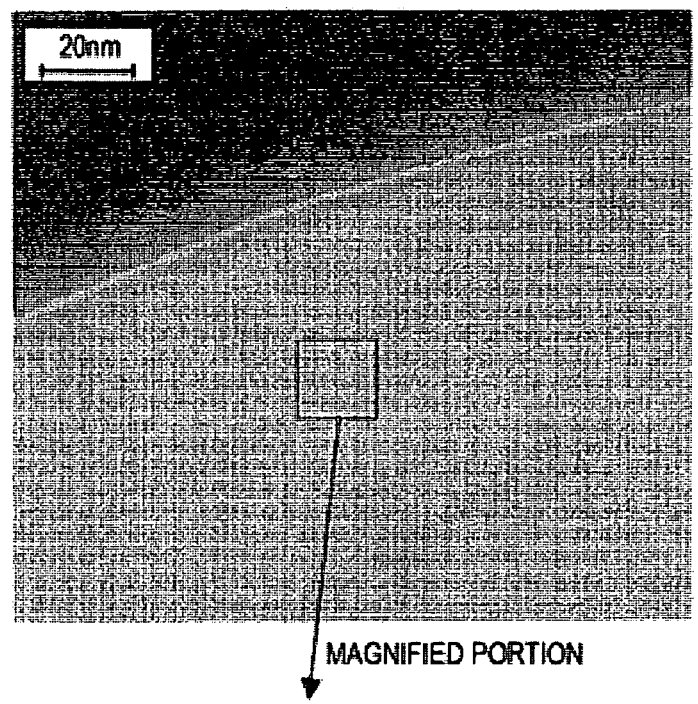
FIG. 18 is a magnified view of the HAADF-STEM image of FIG. 15.
Figure 18:
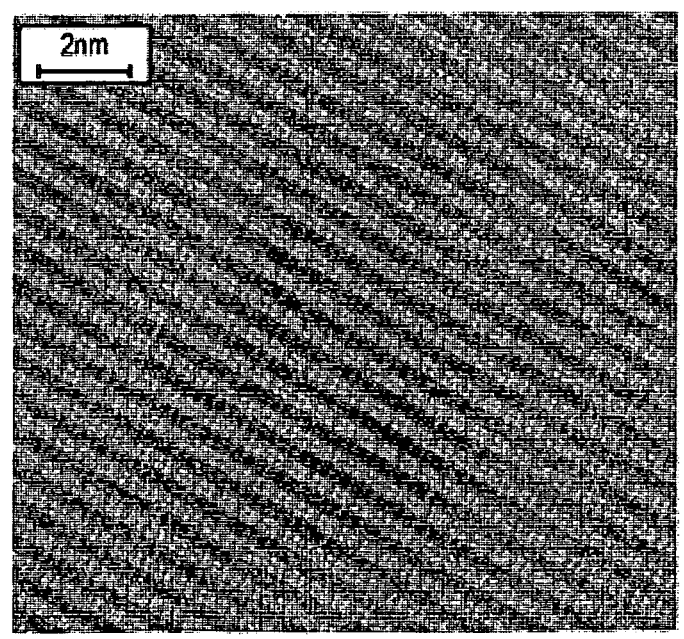

FIG. 18 shows a magnified view of the HAADF-STEM image of FIG. 15. In the figure, orderly lattice patterns were observed in the particle, confirming formation of the red phosphor of a monocrystalline structure by the foregoing producing method. Further, the red phosphor produced had a good match with the orthorhombic system spatial point group Pmn21 model created by Rietveld analysis.

Example 3

Red phosphors of varying aluminum (Al) contents (the atom number ratios y) within the composition formula (1) range were produced according to the procedure described in Example 1. The atom number ratios of the elements other than aluminum (Al) were such that (y+9)/m=2.425, and x/m=3.75%. For comparison, a red phosphor containing no aluminum (Al) (the atom number ratio y=0) was also produced.

Figure 19:
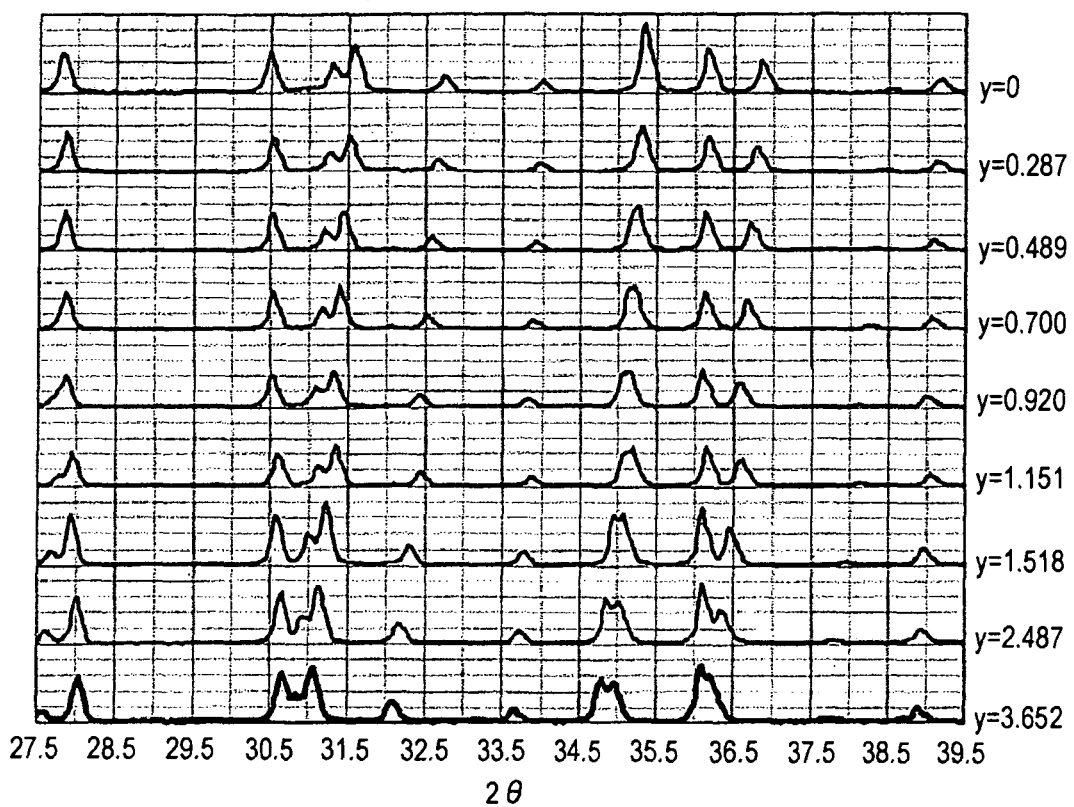
FIG. 19 represents the XDR analysis spectrum of each red phosphor produced in Examples.

FIG. 19 represents the results of XDR analysis for each red phosphor. It can be seen from FIG. 19 that the peak position that occurs at each diffraction angle (2θ) shifts in one direction per peak position as the aluminum (Al) content (the atom number ratio y) is increased from y=0. For example, the peak near the diffraction angle 2θ=30.5 shifts towards increasing diffraction angles (2θ) with increase in aluminum (Al) content (the atom number ratio y). In contrast, the peak near the diffraction angle 2θ=35.5 shifts towards decreasing diffraction angles (2θ) with increase in aluminum (Al) content (the atom number ratio y). Specifically, it can be seen that the a and c axes in the orthorhombic system spatial point group Pmn21 extend while the b axis becomes shorter as the aluminum (Al) content (the atom number ratio y) increases. This tendency was also confirmed at different atom number ratios m, x, and n within the composition formula (1) range.

This demonstrates that changes in the lattice space of the single crystal have occurred as a result of the aluminum (Al) in the red phosphor replacing silicon (Si) so as to constitute part of the single crystal. Specifically, it was confirmed that the red phosphor of single crystal contained aluminum (Al) that constituted part of the single crystal. Further, the red phosphor produced had a good match with the orthorhombic system spatial point group Pmn21 model created by Rietveld analysis.

Example 4

Red phosphors of composition formula (1) were produced with varying amounts of melamine according to the procedure described in Example 1.

Figure 20:
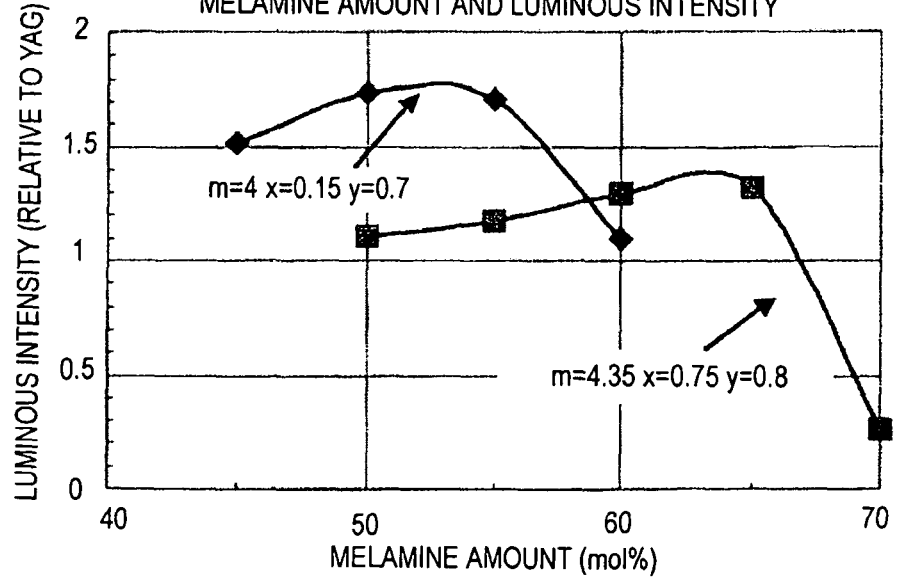
FIG. 20 is a diagram representing the relationship between luminous intensity ratio and the amount of melamine added in the production of a red phosphor.

FIG. 20 represents the luminous intensity of each red phosphor in relation to the amount of melamine as a luminous intensity ratio relative to the YAG:Ce phosphor.

As is clear from FIG. 20, the luminous intensity of the red phosphor varies according to the amount of melamine added in the production of the red phosphor. Because the optimum value of melamine amount that maximizes the luminous intensity varies according to the proportions of the raw materials other than melamine, it is important to select an optimum value for each raw material proportion, specifically, for each composition ratio (1) of the red phosphor to be synthesized.

Example 5

Figure 21:
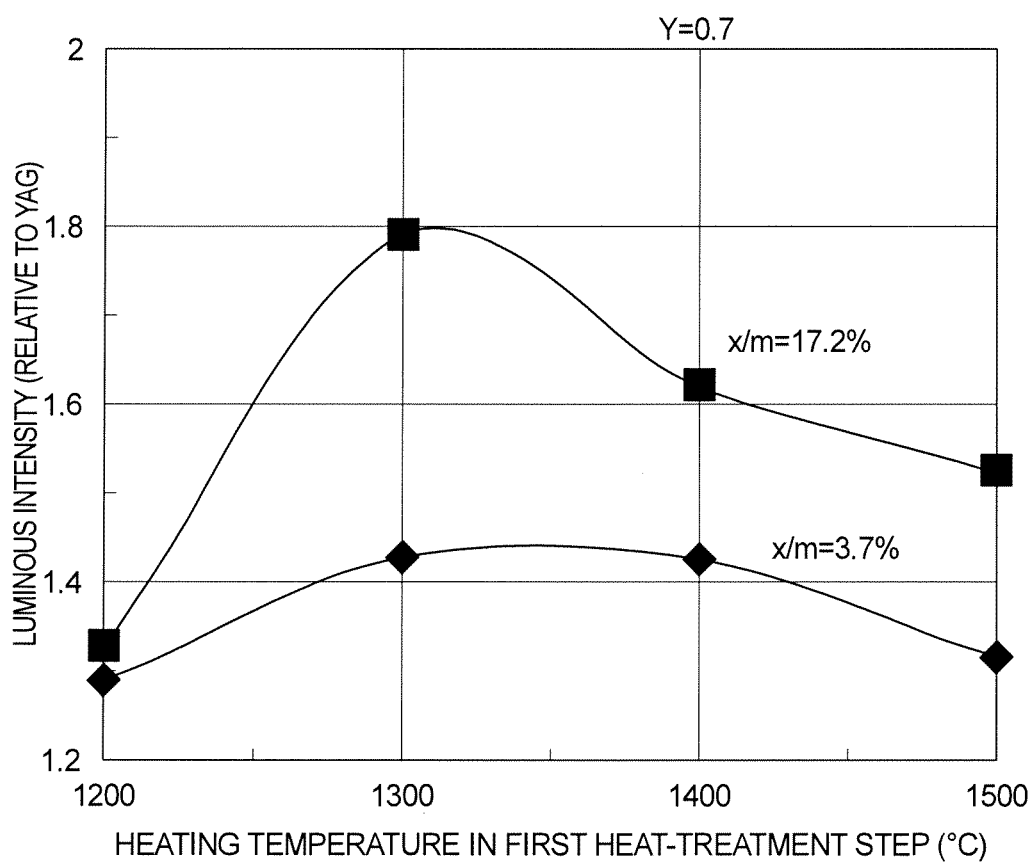
FIG. 21 is a diagram representing the relationship between luminous intensity ratio and the heating temperature in a first heat-treatment step for the production of a red phosphor.

A red phosphor of the composition formula (1) range was produced according to the procedure of Example 1, except that the heating temperature of the first heat-treatment step according to the procedure described in Example 1 was varied. FIG. 21 represents the luminous intensity of the red phosphor, relative to the luminous intensity of the YAG:Ce phosphor.

It can be seen from FIG. 21 that the luminous intensity of the red phosphor varies with the heating temperature of the first heat-treatment step. Thus, in the production of the red phosphor of composition formula (1), it is preferable to optimize the heating temperature of the first heat-treatment step. The preferable temperature was found to be about 1,300° C.

Example 6

Red phosphors were produced as in Example 1, except that the raw material compounds were mixed at the molar ratios presented in Table 3 below according to the procedure described in Example 1. Red phosphors of the composition formula (1) range were obtained in all samples except Si9-10. In Si9-10, an aluminum (Al)-free red phosphor of composition formula (1) with y=0 was obtained.

TABLE 3

| Sample No. | SrCO$_3$ (mol %) | EuN (mol %) | Si$_3$N$_4$ (mol %) | AlN (mol %) | Amount of melamine added (mol %) |
|---|---|---|---|---|---|
| Si9-01 | 42.7 | 11.8 | 35.5 | 10.0 | 60 |
| Si9-02 | 43.2 | 10.8 | 36.0 | 10.0 | 60 |
| Si9-03 | 43.8 | 9.9 | 36.5 | 10.0 | 60 |
| Si9-04 | 44.1 | 9.7 | 36.7 | 10.0 | 60 |
| Si9-05 | 44.4 | 9.2 | 37.0 | 10.0 | 60 |
| Si9-06 | 45.0 | 7.5 | 37.5 | 10.0 | 60 |
| Si9-13 | 40.0 | 10.0 | 40.0 | 10.0 | 60 |
| Si9-14 | 41.4 | 9.7 | 38.9 | 10.0 | 60 |
| Si9-15 | 42.8 | 9.4 | 37.8 | 10.0 | 60 |
| Si9-16 | 44.1 | 9.2 | 36.7 | 10.0 | 60 |
| Si9-17 | 45.3 | 8.9 | 35.8 | 10.0 | 60 |
| Si9-18 | 46.4 | 8.7 | 34.9 | 10.0 | 60 |
| Si9-43 | 45.0 | 8.8 | 37.5 | 8.7 | 45 |
| Si9-44 | 45.0 | 8.8 | 37.5 | 8.7 | 50 |
| Si9-45 | 45.0 | 8.8 | 37.5 | 8.7 | 55 |
| Si9-46 | 45.0 | 8.8 | 37.5 | 8.7 | 60 |
| Si9-47 | 45.0 | 8.8 | 37.5 | 8.7 | 65 |
| Si9-48 | 45.0 | 8.8 | 37.5 | 8.7 | 70 |
| Si9-10 | 47.9 | 10.0 | 42.1 | (0) | 60 |

TABLE 3-continued

| Sample No. | SrCO$_3$ (mol %) | EuN (mol %) | Si$_3$N$_4$ (mol %) | AlN (mol %) | Amount of melamine added (mol %) |
|---|---|---|---|---|---|
| Si9-11 | 44.9 | 9.4 | 39.5 | 6.2 | 60 |
| Si9-12 | 43.1 | 9.0 | 35.9 | 12.0 | 60 |

Emission spectrum was measured for each of the red phosphors produced as above. Measurements were made using a spectrophotometer at an excitation wavelength of 450 nm and over the wavelength range of from 460 nm to 780 nm. The results are presented in Table 4 below.

TABLE 4

| Sample No. | Peak wavelength (nm) | Peak luminous intensity ratio | Chromaticity (X) | Chromaticity (Y) | Relative luminance ratio |
|---|---|---|---|---|---|
| Si9-01 | 673 | 1.23 | 0.685 | 0.314 | 0.89 |
| Si9-02 | 672 | 1.28 | 0.683 | 0.317 | 1.00 |
| Si9-03 | 666 | 1.34 | 0.680 | 0.319 | 1.16 |
| Si9-04 | 664 | 1.38 | 0.680 | 0.319 | 1.20 |
| Si9-05 | 667 | 1.42 | 0.679 | 0.320 | 1.27 |
| Si9-06 | 660 | 1.27 | 0.676 | 0.324 | 1.26 |
| Si9-13 | 665 | 0.85 | 0.679 | 0.320 | 0.73 |
| Si9-14 | 667 | 1.22 | 0.683 | 0.316 | 0.97 |
| Si9-15 | 667 | 1.35 | 0.682 | 0.317 | 1.11 |
| Si9-16 | 672 | 1.33 | 0.680 | 0.318 | 1.00 |
| Si9-17 | 665 | 1.31 | 0.678 | 0.321 | 1.13 |
| Si9-18 | 666 | 1.22 | 0.677 | 0.322 | 1.12 |
| Si9-43 | 673 | 0.98 | 0.671 | 0.327 | 0.93 |
| Si9-44 | 673 | 1.04 | 0.677 | 0.321 | 0.90 |
| Si9-45 | 673 | 1.09 | 0.678 | 0.320 | 0.94 |
| Si9-46 | 662 | 1.25 | 0.674 | 0.324 | 1.27 |
| Si9-47 | 662 | 1.34 | 0.678 | 0.321 | 1.31 |
| Si9-48 | 658 | 0.35 | 0.671 | 0.327 | 0.39 |
| Si9-10 | 664 | 1.15 | 0.679 | 0.320 | 0.96 |
| Si9-11 | 673 | 1.26 | 0.681 | 0.318 | 1.01 |
| Si9-12 | 666 | 1.16 | 0.680 | 0.319 | 0.99 |

Luminous intensity ratio is the relative value with respect to peak luminous intensity of (YAG:Ce) as the standard.
Peak luminous intensity of (YAG:Ce) corresponds to 61 × 10$^5$ cps.
Relative luminance ratio is the relative value with respect to luminance of (CaS:Eu) as the standard.
Corresponds to 15% of (YAG:Ce) luminance ratio For comparison, Table 5 below presents the measurement results for the YAG:Ce phosphor and CaS:Eu red sulfide phosphor used as standard phosphors.

TABLE 5

| Sample as standard | Peak wavelength (nm) | Peak luminous intensity ratio | Chromaticity (X) | Chromaticity (Y) | Relative luminance ratio | |
|---|---|---|---|---|---|---|
| YAG:Ce | 566 | 61 | 0.465 | 0.517 | 5.50 | (Green standard) |
| CaS:Eu | 656 | 80 | 0.702 | 0.296 | 1.00 | (Red Sulfide standard) |

As presented in Tables 3 and 4, the peak luminous intensity ratio of the red phosphor was 1.0 or more in samples Si9-01 to Si9-06, Si9-10 to Si9-12, Si9-14 to Si9-18, and Si9-44 to Si9-47.

The relative luminance ratio with respect to luminance of the CaS:Eu red sulfide phosphor as the standard (hereinafter, "relative luminance ratio") was 1.0 or more in samples Si9-02 to Si9-06, Si9-Si9-11, Si9-15 to Si9-18, Si9-Si9-46, and Si9-Si9-47.

Thus, in order to produce red phosphors with the peak luminous intensity ratio of 1.0 or more, and the relative luminance ratio of 1.0 or more, each raw material needs to have the following component ratio, for example.

Strontium carbonate: 42.8 mol % or more, and 46.4 mol % or less.
Europium nitride: 7.5 mol % or more, and 10.8 mol % or less.
Silicon nitride: 36.0 mol % or more, and 37.8 mol % or less.
Aluminum nitride: 8.7 mol % or more, and 10.0 mol % or less.

In addition, the amount of melamine added is 60 mol % or more, and 65 mol % or less with respect to the total number of moles of the strontium carbonate, silicon nitride, europium nitride, aluminum nitride, and melamine.

The component ratio of melamine is particularly important in the producing method. As described above, melamine, with the melting point of 250° C. or less, undergoes pyrolysis in the first heat-treatment step. The carbon (C) and hydrogen (H)

generated by the pyrolysis of melamine bind to the oxygen (O) contained in the strontium carbonate, and produce carbon oxide gas (CO or $CO_2$) or $H_2O$. The carbon oxide gas and $H_2O$ evaporate, and are removed from the first calcined product. Thus, the melamine should not be deficient or in excess.

Figure 22:
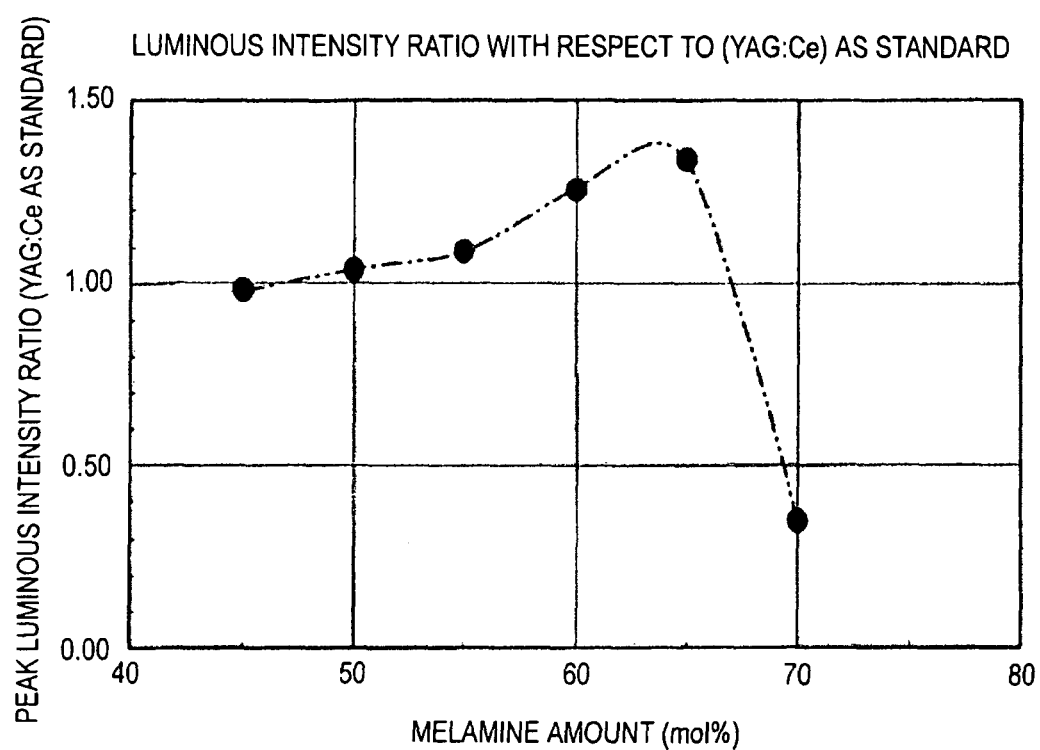
FIG. 22 is a diagram representing the relationship between peak luminous intensity ratio and the amount of melamine added in the production of a red phosphor.
Figure 23:
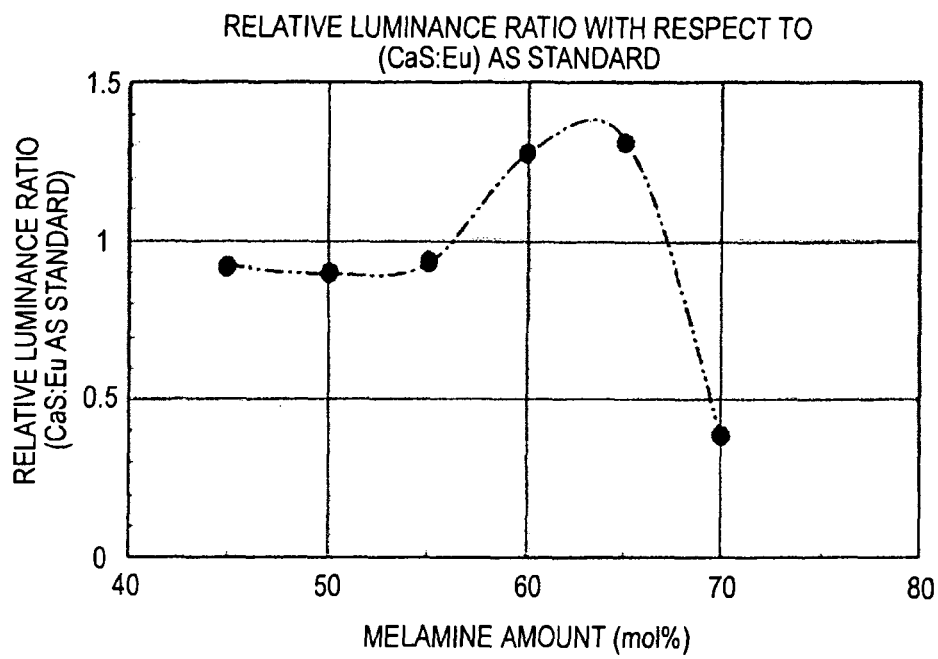
FIG. 23 is a diagram representing the relationship between relative luminance ratio and the amount of melamine added in the production of a red phosphor.

For example, FIGS. 22 and 23 represent the results for Si-43 to Si-48 presented in Tables 3 and 4. FIG. 23 represents peak luminous intensity as a function of the amount of melamine added. FIG. 23 represents luminance as a function of the amount of melamine added.

As is clear from FIG. 23, the peak luminous intensity ratio is 1.0 or more for the melamine amount of from 45 mol % to 67 mol %.

Further, as is clear from FIG. 23, the relative luminance ratio is 1.0 or more for the melamine amount of from 56 mol % to 68 mol %.

Thus, in the raw material proportions for Si-43 to Si-48, the melamine amount is preferably from 56 mol % to 68 mol %. It can be inferred from FIGS. 22 and 23 that the melamine amount may have an addition of about ±3 mol % above and below this range.

Figure 24:
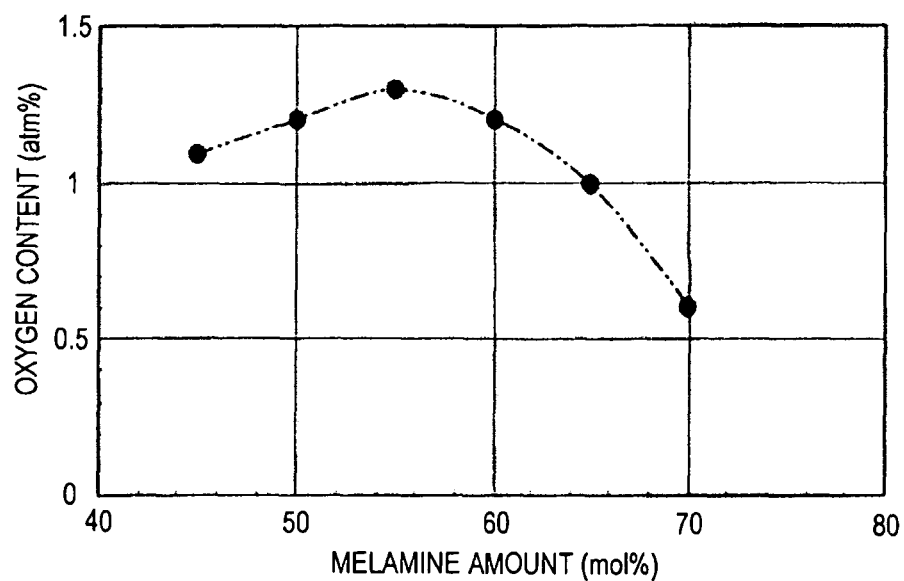
FIG. 24 is a diagram representing the relationship between the amount of melamine added in the production of a red phosphor, and the amount of oxygen remaining in the red phosphor.
Figure 25:
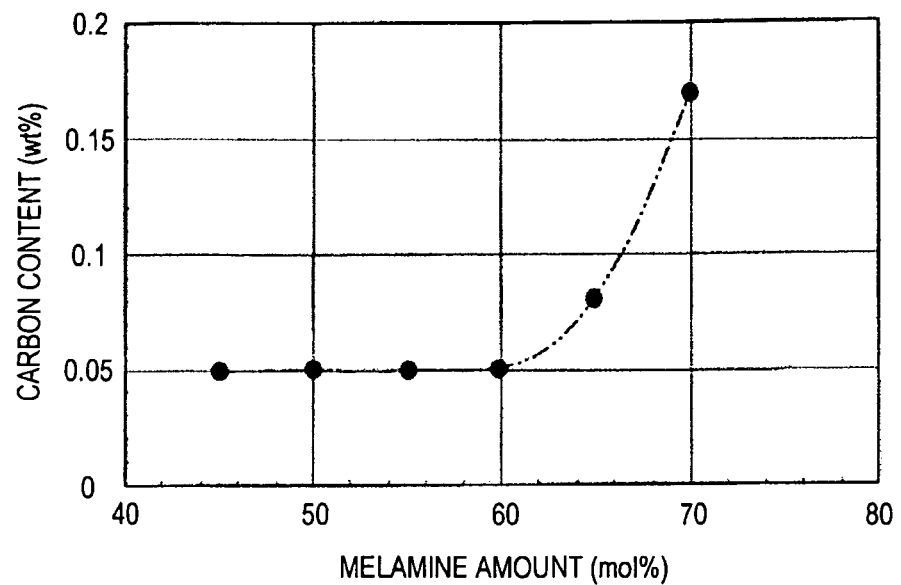
FIG. 25 is a diagram representing the relationship between the amount of melamine added in the production of a red phosphor, and the amount of carbon remaining in the red phosphor.

FIG. 24 represents the relationship between the amount of melamine added and the remaining oxygen amount in the red phosphor. FIG. 25 represents the relationship between the amount of melamine added and the remaining carbon amount in the red phosphor.

As can be seen in FIG. 24, the oxygen content in the red phosphor varies with changes in melamine amount.

The oxygen reduction in the red phosphor becomes particularly prominent with the melamine amounts of 55 mol % and higher. This is because the oxygen in the strontium carbonate binds to the carbon or hydrogen produced by the pyrolysis of melamine, and is removed in the form of, for example, carbon oxide gas (CO, $CO_2$, etc.) or $H_2O$.

However, when the melamine component ratio is as high as 70 mol %, the amount of carbon becomes excessively large with the excess amount of remaining carbon after the melamine pyrolysis in the first heat-treatment step. For example, the peak luminous intensity ratio is 0.35, and the relative luminance ratio is 0.39 when the remaining carbon amount in the red phosphor is 0.1 wt %. Such residual carbon is considered to be partly responsible for the large reductions in luminous intensity and luminance.

It is therefore preferable that the melamine may be added in an amount of from 60 mol % to 65 mol %, as described above.

Figure 26:
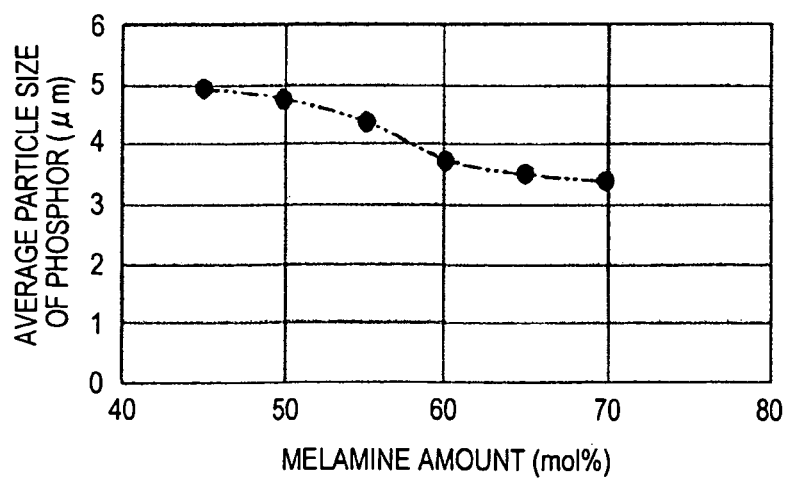
FIG. 26 is a diagram representing the relationship between the amount of melamine added in the production of a red phosphor, and the average particle size of the red phosphor.

The particle size of the red phosphor depends upon the amount of melamine added. As represented in FIG. 26, the particle size of the red phosphor decreases with increase in melamine amount. For example, the average particle size of the red phosphor was about 5 μm with the melamine amount of 45 mol %, about 3.7 μm with the melamine amount of 60 mol %, and about 3.5 μm with the melamine amount of 65 mol %.

As demonstrated above, the melamine amount is important in terms of ease of production of a fine powdery red phosphor.

Addition amount of europium nitride was examined. Based on Tables 3 and 4, FIG. 27 represents the relationship between the peak luminous intensity of the red phosphor and the amount of europium nitride, and FIG. 28 represents the relationship between the luminance of the red phosphor and the amount of europium nitride.

Figure 27:
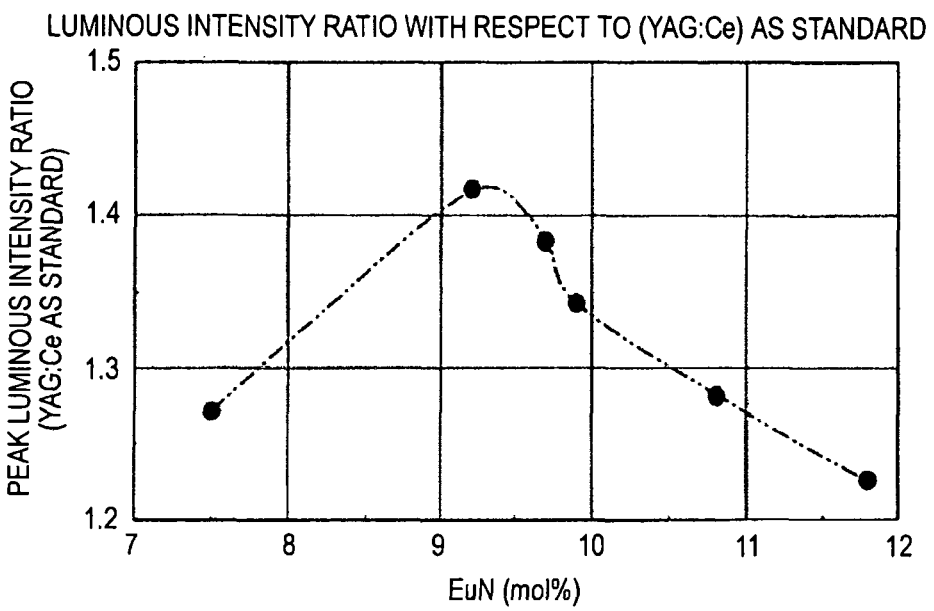
FIG. 27 is a diagram representing the relationship between the amount of europium nitride added in the production of a red phosphor, and the peak luminous intensity ratio of the red phosphor.

As is clear from FIG. 27, the peak luminous intensity ratio is 1.0 or more when the europium nitride amount is from about 7.0 mol % to about 12.0 mol %.

Figure 28:
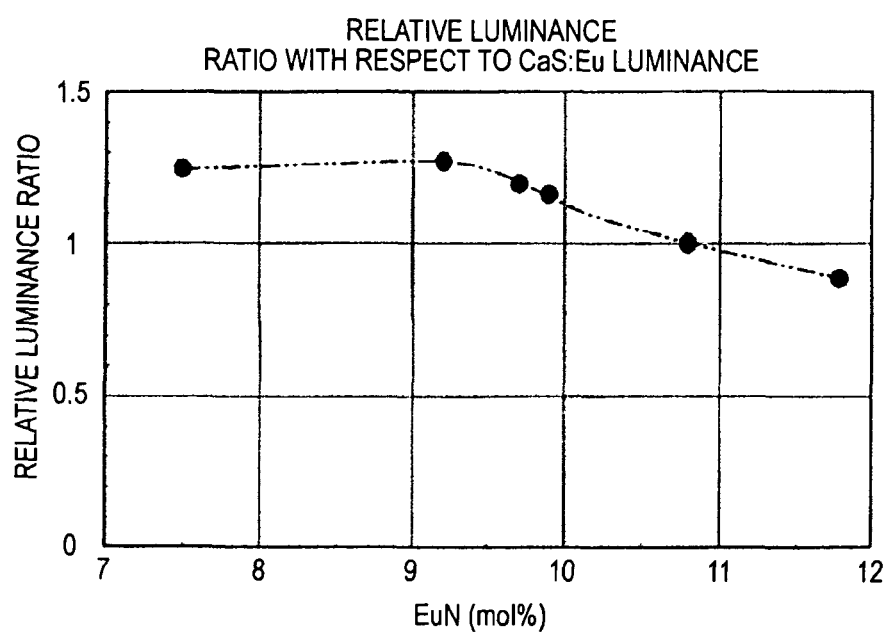
FIG. 28 is a diagram representing the relationship between the amount of europium nitride added in the production of a red phosphor, and the relative luminance ratio of the red phosphor.

As is clear from FIG. 28, the relative luminance ratio is 1.0 or more when the europium nitride amount is from 7.0 mol % to 11.0 mol %.

However, as can be seen from Tables 3 and 4, there are cases where, as in sample Si9-13, the peak luminous intensity ratio is 0.85 even with the europium nitride amount of 10.0 mol %. This is believed to be due to the small amount of strontium carbonate added. As in this case, the europium nitride amount may be influenced by the amounts of other raw materials. Considering this, the europium nitride amount is more preferably from 7.0 mol % to 12.5 mol %.

Figure 29:
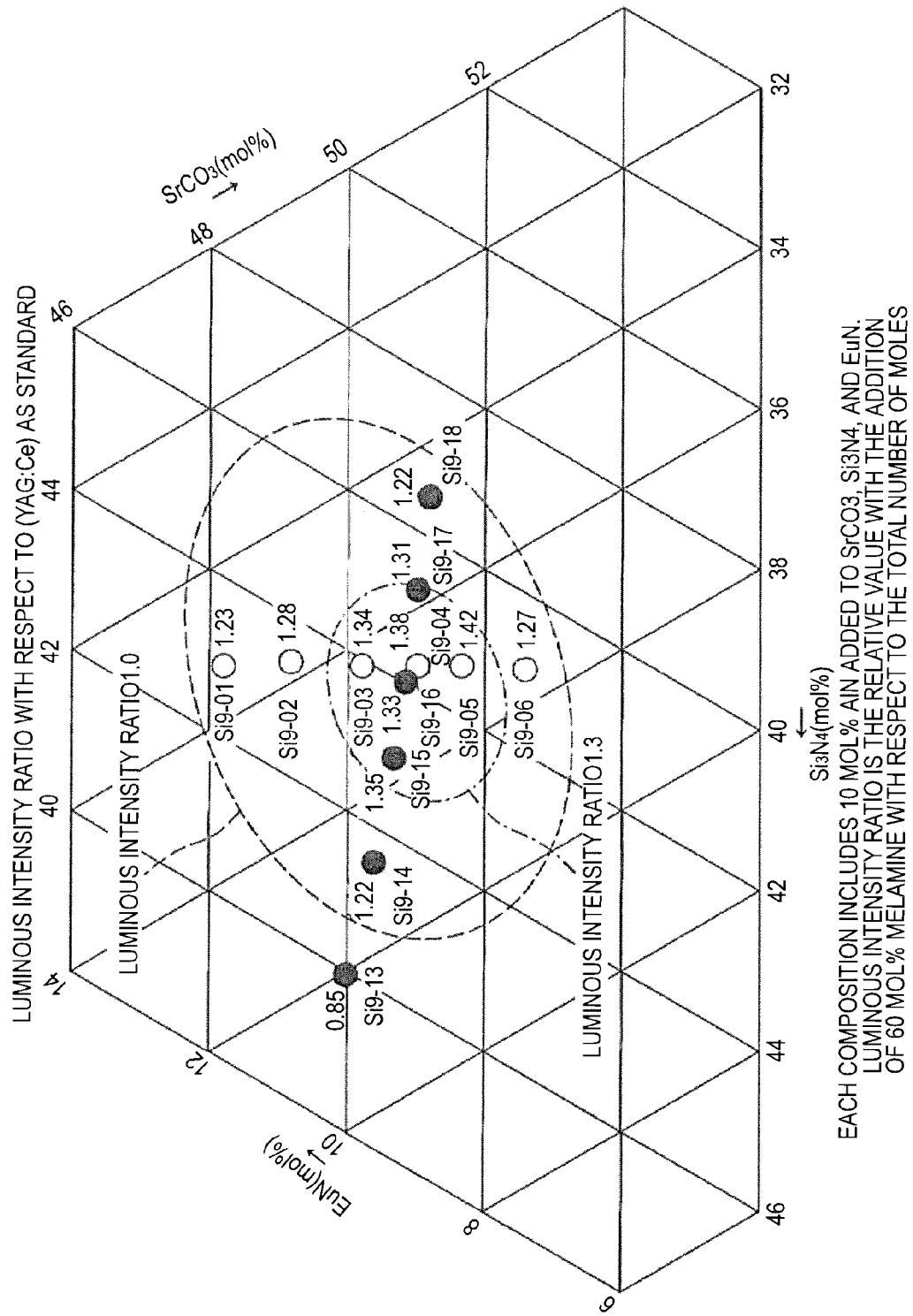
FIG. 29 is a diagram representing ratios with varying component ratios of strontium carbonate, europium nitride, and silicon nitride under fixed component ratios of melamine and aluminum nitride.

Based on Tables 3 and 4, FIG. 29 represents peak luminous intensity distribution with varying ratios of strontium carbonate, europium nitride, and silicon nitride under the fixed melamine and aluminum nitride ratios of 60 mol % and 10.0 mol %, respectively. The figure is shown with sample numbers and peak luminous intensity values.

As shown in FIG. 29, samples Si9-01 to Si9-06, and samples Si9-15 to Si9-18 had peak luminous intensity ratios of 1.2 and higher. In particular, samples Si9-03 to Si9-05 and samples Si9-15 to Si9-17 had highly desirable peak luminous intensity ratios of 1.3 and higher.

Figure 30:
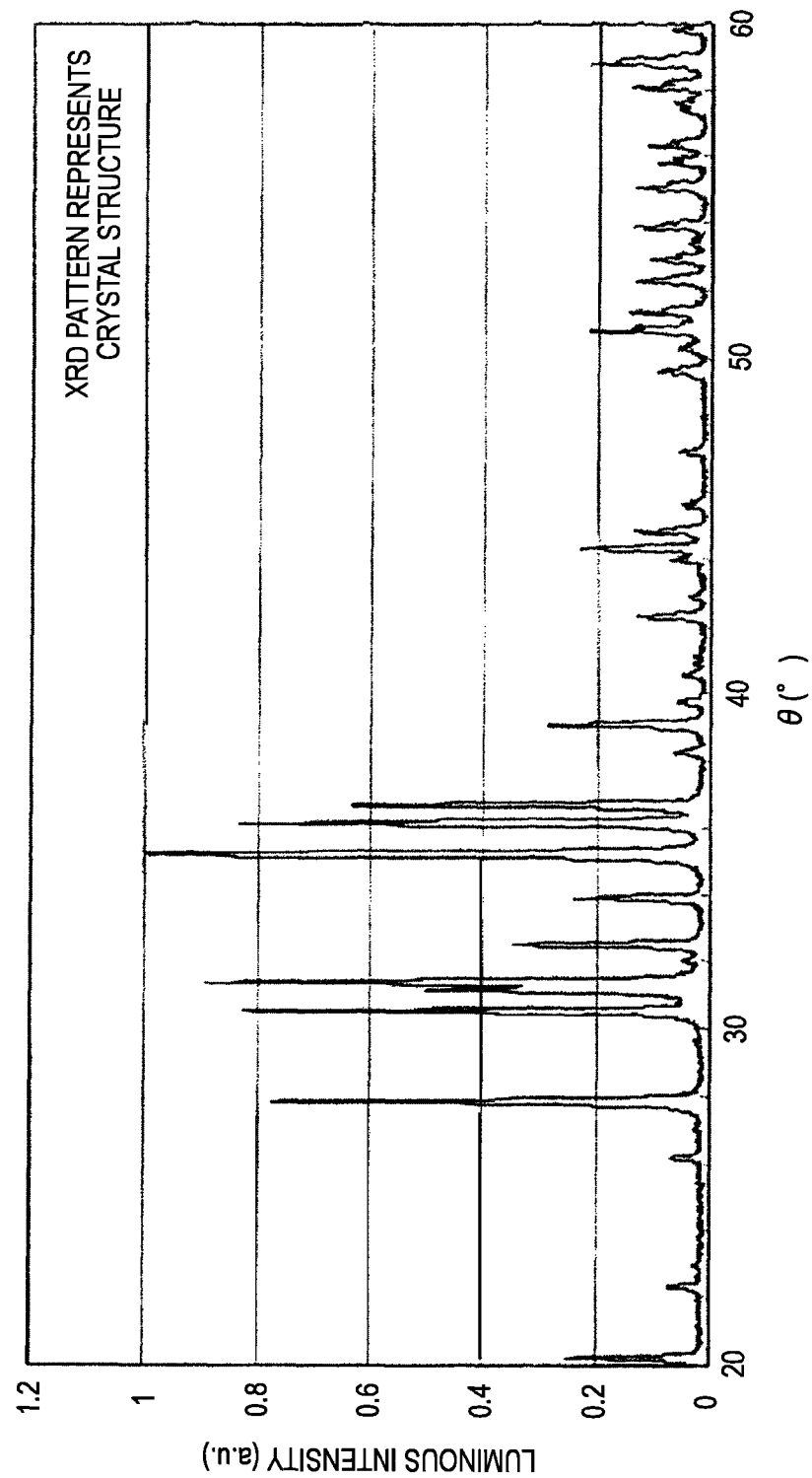
FIG. 30 is a diagram representing the X-ray diffraction pattern of a red phosphor produced by a producing method of the embodiment.

The red phosphor of sample Si9-47 with the emission peak wavelength of 662 nm was examined with regard to its X-ray diffraction pattern for Cu-Kα radiation, using a powder X-ray diffractometer available from Rigaku Corporation. The result is shown in FIG. 30. Specifically, the figure represents the crystal structure of the phosphor. From the X-ray analysis pattern, it was confirmed that the red phosphor obtained by the foregoing producing method was of the orthorhombic system spatial point group Pmn21.

Example 7

Red phosphors were produced using the additional raw material compound calcium nitride ($Ca_3N_2$) according to the procedure of Example 1. The red phosphors were produced as in Example 1, except that the raw material compounds were mixed at the molar ratios presented in Table 6 below.

TABLE 6

| (Si9) | $Ca_3N_2$ (mol %) | $SrCO_3$ (mol %) | EuN (mol %) | $Si_3N_4$ (mol %) | AlN (mol %) | Amount of melamine added (mol %) |
|---|---|---|---|---|---|---|
| Si9—Ca01 | 0 | 44.2 | 9.2 | 44.2 | 9.8 | 60 |
| Si9—Ca02 | 4.5 | 34.7 | 10.0 | 40.1 | 10.7 | 60 |
| Si9—Ca03 | 7.0 | 29.4 | 10.5 | 42.0 | 11.2 | 60 |
| Si9—Ca04 | 9.8 | 23.5 | 11.0 | 44.0 | 11.7 | 60 |

Emission spectrum was measured for each of the red phosphors produced as above. Measurements were made using a spectrophotometer at an excitation wavelength of 450 nm and over the wavelength range of from 460 nm to 780 nm. The results are presented in Table 7 below.

TABLE 7

| (Si9) | Peak wavelength (nm) | Peak luminous intensity ratio | Chromaticity (X) | Chromaticity (Y) | Relative luminance ratio |
|---|---|---|---|---|---|
| Si9—Ca01 | 664 | 1.31 | 0.680 | 0.320 | 1.12 |
| Si9—Ca02 | 678 | 1.30 | 0.685 | 0.315 | 0.88 |
| Si9—Ca03 | 679 | 1.24 | 0.688 | 0.312 | 0.73 |
| Si9—Ca04 | 684 | 1.18 | 0.690 | 0.310 | 0.63 |

As can be seen in Tables 6 and 7, it was confirmed that the peak emission wavelength shifts towards the longer wavelength side with increase in calcium nitride amount. For example, the peak emission wavelength was 664 nm when no calcium nitride was added. The peak emission wavelength was 678 nm with the calcium nitride amount of 4.5 mol %, 679 nm with the calcium nitride amount of 7.0 mol %, and 684 nm with the calcium nitride amount of 9.8 mol %.

However, the luminance decrease tended to become more prominent as the calcium nitride amount was increased. Thus, while the addition of calcium nitride can shift the peak emission wavelength, sufficient care must be taken not to lower the luminance.

When the calcium nitride amount is 9.8 mol % or less, or when the calcium nitride was not added, luminous intensity with the peak luminous intensity ratio of 1.0 or more was obtained. Further, luminous intensity with the peak luminous intensity ratio of 1.18 was obtained even when the amount of calcium nitride compound was 9.8 mol %.

Thus, it can be said that the calcium nitride amount does not have serious effects on luminous intensity, as long as it falls within the foregoing range.

In the red phosphor producing method, the ratios of strontium carbonate ($SrCO_3$), europium nitride (EuN), silicon nitride ($Si_3N_4$), aluminum nitride (AlN), and melamine ($C_3H_6N_6$) can be set within the following maximum ranges by adjusting the ratio of each raw material compound.

Strontium carbonate: 23.5 mol % or more, and 47.0 mol % or less.
Silicon nitride: 33.0 mol % or more, and 41.0 mol % or less.
Europium nitride: 7.0 mol % or more, and 12.5 mol % or less.
Aluminum nitride: at least contained in an amount of 12.0 mol % or less.

In addition, the melamine is added in an amount of from 60 mol % to 65 mol % with respect to the total number of moles of the strontium carbonate, silicon nitride, europium nitride, and aluminum nitride.

In the red phosphor producing method, melamine is used as the carbon source. However, for example, organic substances containing carbon, hydrogen, and nitrogen may be used instead of the melamine. Oxygen-containing organic substances are not preferable. A carbon powder also can be used instead of the melamine.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A red phosphor comprising:
an element A, europium (Eu), silicon (Si), aluminum (Al), oxygen (O), and nitrogen (N) at the atom number ratio of the composition formula (1)

$$[A_{(m-x)}Eu_x]Si_9Al_yO_nN_{[12+y-2(n-m)/3]} \quad \text{Composition Formula (1); and}$$

Carbon,
wherein the amount of carbon ranges from about 0.05 to about 0.08 wt %, the element A in the composition formula (1) is at least one of magnesium (Mg), calcium (Ca), strontium (Sr), and barium (Ba), and m, x, y, and n in the composition formula (1) satisfy the relations $4.5<m<5$, $0<x<1$, $0<y<2$, and $0<n<10$, and wherein the compound of the composition formula (1) has a crystal structure that belongs to an orthorhombic system spatial point group $Pmn2_1$.

2. The red phosphor according to claim 1, wherein the carbon is produced through a mixing of a carbonate compound of element A and melamine, and heat treating the mixture to produce the carbon and hydrogen as the mixture undergoes pyrolysis.

3. The red phosphor according to claim 2, wherein the amount of melamine in the mixture is 60 to 65 mol % relative to the amount of the carbonate compound of element A.

4. The red phosphor according to claim 2, wherein at least a portion of the produced carbon is evaporated after binding to the oxygen atoms in the carbonate compound of element A to form a carbon oxide gas, the evaporation of the carbon oxide gas thereby reducing an amount of the oxygen in the red phosphor.

5. The red phosphor of claim 1, wherein the element A is strontium (Sr).

6. A method for producing a red phosphor, the method comprising:
preparing a carbonate compound of an element A, europium nitride, silicon nitride, and aluminum nitride so as to contain the element A, europium (Eu), silicon (Si), and aluminum (Al) at the atom number ratio of the composition formula (1) below, and mixing melamine to produce a mixture including, $$[A_{(m-x)}Eu_x]Si_9Al_yO_nN_{[12+y-2(n-m)/3]} \quad \text{Composition Formula (1);}$$

calcining the mixture to produce carbon; and
pulverizing a calcined product of the mixture,
wherein the amount of carbon in the mixture ranges from about 0.05 to about 0.08 wt %, the element A in the composition formula (1) is at least one of magnesium (Mg), calcium (Ca), strontium (Sr), and barium (Ba), and m, x, y, and n in the composition formula (1) satisfy the relations $4.5<m<5$, $0<x<1$, $0<y<2$, and $0<n<10$, and wherein the compound of the composition formula (1) has a crystal structure that belongs to an orthorhombic system spatial point group $Pmn2_1$.

7. The method for producing a red phosphor according to claim 6, wherein the calcining of the mixture produces the carbon and hydrogen as the mixture undergoes pyrolysis.

8. The method for producing a red phosphor according to claim 6, wherein the amount of melamine is 60 to 65 mol % relative to the amount of the carbonate compound of element A.

9. The method for producing a red phosphor according to claim 6, further comprising: forming carbon oxide gas through bonding of a portion of the produced carbon with oxygen atoms in the carbonate compound of element A; and evaporating at least a portion of the carbon oxide gas to reduce an amount of the oxygen in the red phosphor.

10. The method for producing a red phosphor of claim 6, wherein the element A is strontium (Sr).

11. The method for producing the red phosphor of claim 6, wherein the calcining of the mixture, and the pulverization of the calcined product of the mixture are repeated.

* * * * *